United States Patent
Harada et al.

(10) Patent No.: US 10,054,870 B2
(45) Date of Patent: Aug. 21, 2018

(54) SURFACE-EMITTING LASER, SURFACE-EMITTING LASER ARRAY, LASER DEVICE, IGNITOR, INTERNAL COMBUSTION ENGINE, OPTICAL SCANNER, IMAGE FORMING APPARATUS, LIGHT TRANSMISSION MODULE, AND LIGHT EMISSION SYSTEM

(71) Applicants: Shinichi Harada, Kanagawa (JP); Naoto Jikutani, Miyagi (JP); Kazuma Izumiya, Miyagi (JP); Yusuke Okura, Miyagi (JP)

(72) Inventors: Shinichi Harada, Kanagawa (JP); Naoto Jikutani, Miyagi (JP); Kazuma Izumiya, Miyagi (JP); Yusuke Okura, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/364,445

(22) Filed: Nov. 30, 2016

(65) Prior Publication Data
US 2017/0168412 A1 Jun. 15, 2017

(30) Foreign Application Priority Data
Dec. 11, 2015 (JP) ................ 2015-241895

(51) Int. Cl.
*H01S 5/183* (2006.01)
*G03G 15/04* (2006.01)
(Continued)

(52) U.S. Cl.
CPC .............. *G03G 15/04* (2013.01); *F02P 23/04* (2013.01); *G02B 19/0057* (2013.01);
(Continued)

(58) Field of Classification Search
CPC ........... G03G 15/04; F02P 23/04; H04N 1/06; H04N 1/0284; H04N 1/0283; H01S 5/423;
(Continued)

(56) References Cited

U.S. PATENT DOCUMENTS

| 6,351,579 B1 * | 2/2002 | Early ..................... G02B 6/351 385/16 |
| 2003/0053501 A1 | 3/2003 | Sekiya et al. |

(Continued)

FOREIGN PATENT DOCUMENTS

| JP | 2003-188471 | 7/2003 |
| JP | 2003-258379 | 9/2003 |

(Continued)

OTHER PUBLICATIONS

European search report dated Apr. 13, 2017 in connection with corresponding European patent application No. 16200310.7.
(Continued)

*Primary Examiner* — Xinning Niu
(74) *Attorney, Agent, or Firm* — Cooper & Dunham LLP

(57) ABSTRACT

A surface-emitting laser includes an active layer on which a spacer layer is disposed, and a reflection mirror disposed on the spacer layer, including a current constriction layer that is a selectively-oxidized layer having been selectively oxidized. The current constriction layer is disposed at a position of a node of a standing-wave of an electric field of light oscillated at the active layer and is disposed away from an interface between the spacer layer and the reflection mirror by an optical distance of one-fourth of an oscillation wavelength at the active layer. The selectively-oxidized layer is made of AlGaAs. The reflection mirror includes at least one AlGaInP layer contacting the selectively-oxidized layer.

20 Claims, 33 Drawing Sheets

(51) Int. Cl.
*H01S 5/343* (2006.01)
*H01S 5/42* (2006.01)
*G02B 19/00* (2006.01)
*H04N 1/028* (2006.01)
*H04N 1/06* (2006.01)
*F02P 23/04* (2006.01)

(52) U.S. Cl.
CPC ...... *H01S 5/18311* (2013.01); *H01S 5/34313* (2013.01); *H01S 5/423* (2013.01); *H04N 1/0283* (2013.01); *H04N 1/0284* (2013.01); *H04N 1/06* (2013.01)

(58) Field of Classification Search
CPC ............ H01S 5/18311; H01S 5/34313; G02B 19/0057
See application file for complete search history.

(56) References Cited

U.S. PATENT DOCUMENTS

| | | | |
|---|---|---|---|
| 2004/0091011 A1 | 5/2004 | Naoto et al. | |
| 2005/0025211 A1* | 2/2005 | Zhang | H01S 5/423 372/101 |
| 2006/0093010 A1 | 5/2006 | Sekiya et al. | |
| 2008/0043796 A1 | 2/2008 | Jikutani et al. | |
| 2008/0056321 A1 | 3/2008 | Motomura et al. | |
| 2008/0233017 A1 | 9/2008 | Sato et al. | |
| 2009/0022199 A1 | 1/2009 | Jikutani et al. | |
| 2009/0285252 A1 | 11/2009 | Ishii et al. | |
| 2009/0285602 A1 | 11/2009 | Harasaka et al. | |
| 2010/0158065 A1 | 6/2010 | Jikutani et al. | |
| 2010/0189467 A1* | 7/2010 | Sato | B41J 2/45 372/46.013 |
| 2010/0328747 A1* | 12/2010 | Jikutani | B41J 2/45 359/205.1 |
| 2011/0037825 A1 | 2/2011 | Jikutani et al. | |
| 2011/0115872 A1 | 5/2011 | Harasaka et al. | |
| 2011/0128343 A1 | 6/2011 | Sato et al. | |
| 2011/0170155 A1 | 7/2011 | Jikutani et al. | |
| 2011/0217077 A1 | 9/2011 | Harasaka et al. | |
| 2012/0121297 A1 | 5/2012 | Jikutani et al. | |
| 2012/0294652 A1 | 11/2012 | Itoh et al. | |
| 2013/0077647 A1 | 3/2013 | Jikutani et al. | |
| 2013/0194787 A1* | 8/2013 | Geske | H01S 5/187 362/157 |
| 2013/0208067 A1 | 8/2013 | Izumiya et al. | |
| 2013/0243022 A1 | 9/2013 | Harasaka et al. | |
| 2014/0105647 A1 | 4/2014 | Harasaka et al. | |
| 2015/0063396 A1 | 3/2015 | Jikutani et al. | |
| 2016/0043528 A1 | 2/2016 | Adachi et al. | |
| 2016/0094003 A1 | 3/2016 | Numata et al. | |
| 2016/0094006 A1 | 3/2016 | Hagita et al. | |
| 2016/0094009 A1 | 3/2016 | Izumiya et al. | |
| 2016/0276809 A1 | 9/2016 | Okura et al. | |

FOREIGN PATENT DOCUMENTS

| | | |
|---|---|---|
| JP | 2006-303415 | 11/2006 |
| JP | 2012-231178 | 11/2012 |
| JP | 2014-192166 | 10/2014 |
| JP | 2015-144299 | 8/2015 |

OTHER PUBLICATIONS

G.M.Yang, et al:"Ultralow threshold current vertical-cavity surface-emitting lasers obtained with selective oxidation", Electron. Lett. vol. 31, No. 11 pp. 886-888 (1995).

Aaron E.Bond, et al:"Design of Low-Loss Single-Mode Vertical-Cavity Surface-Emitting Lasers", IEEE Journal of selected topics in quantum electronics, vol. 5, No. 3, pp. 574-581 (1999).

* cited by examiner

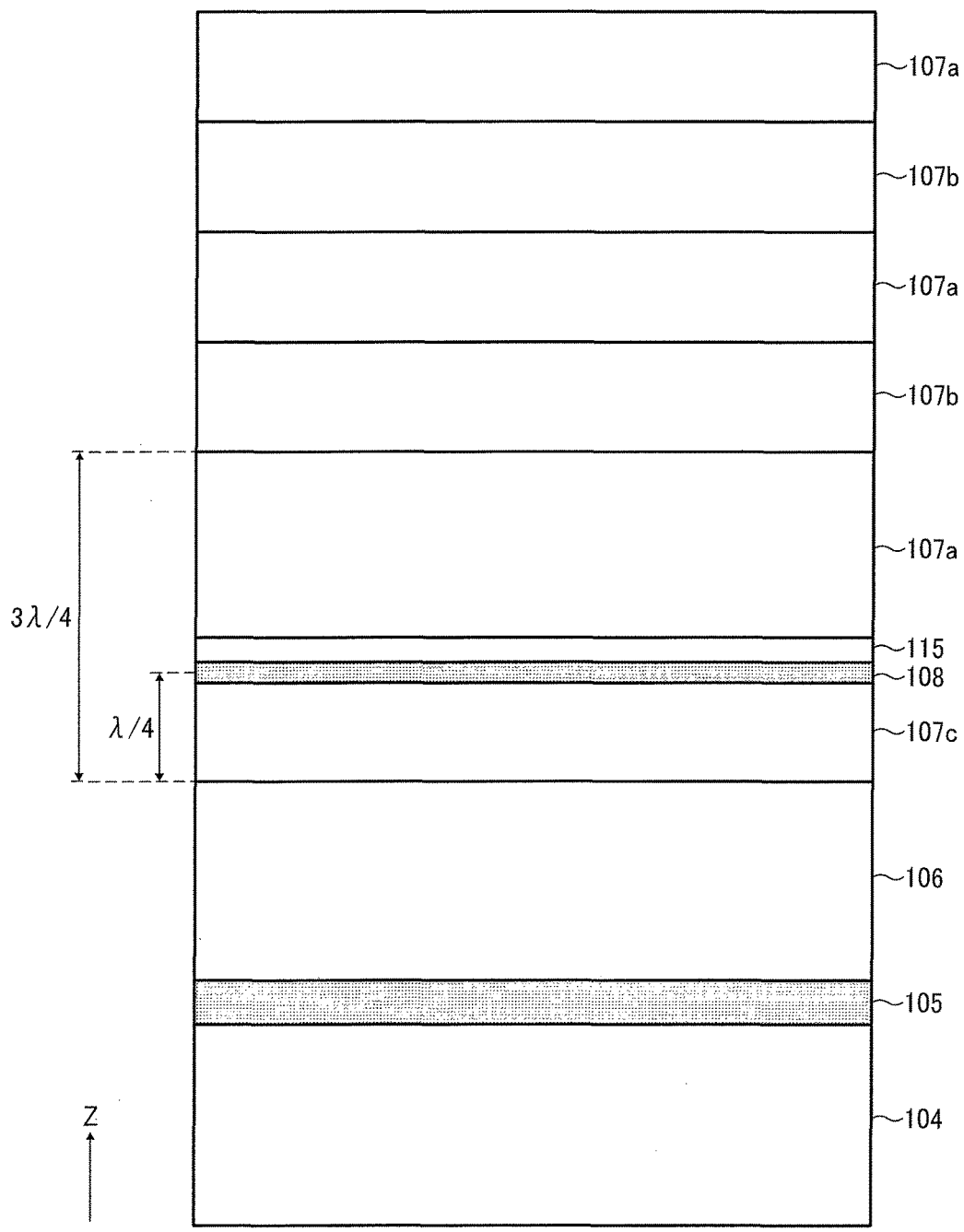

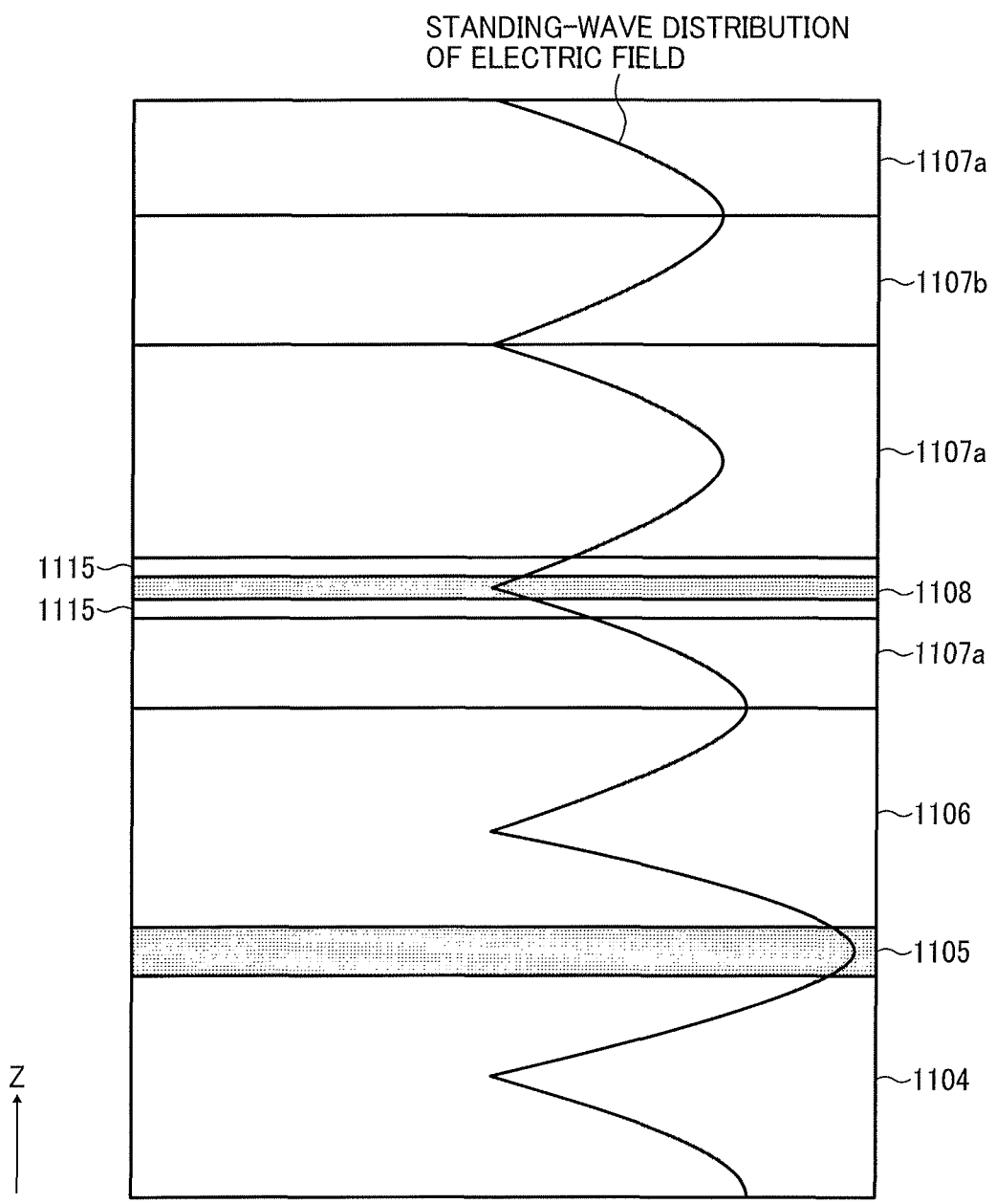

SURFACE-EMITTING LASER, SURFACE-EMITTING LASER ARRAY, LASER DEVICE, IGNITOR, INTERNAL COMBUSTION ENGINE, OPTICAL SCANNER, IMAGE FORMING APPARATUS, LIGHT TRANSMISSION MODULE, AND LIGHT EMISSION SYSTEM

CROSS-REFERENCE TO RELATED APPLICATION

This patent application is based on and claims priority pursuant to 35 U.S.C. § 119(a) to Japanese Patent Application No. 2015-241895, filed on Dec. 11, 2015, in the Japan Patent Office, the entire disclosure of which is hereby incorporated by reference herein.

BACKGROUND

Technical Field

Embodiments of the present disclosure relate to a surface-emitting laser, a surface-emitting laser array, a laser device, an ignitor, an internal combustion engine, an optical scanner, an image forming apparatus, a light transmission module, and a light transmission system. More specifically, the embodiments of the present disclosure relate to a vertical-cavity surface-emitting laser, a surface-emitting laser array including a plurality of surface-emitting lasers, a laser device including the surface-emitting laser array, an ignitor including the laser device, an internal combustion engine including the ignitor, an optical scanner including the surface-emitting laser or the surface-emitting laser array, an image forming apparatus including the optical scanner, an image forming apparatus including the optical scanner, a light transmission module including the surface-emitting laser array, and a light transmission system including the light transmission module.

Related Art

A vertical-cavity surface-emitting laser (VCSEL) is a laser that emits light in a direction perpendicular to a substrate of the surface-emitting laser. Such a surface-emitting laser that is suitable for two-dimensional array achieves lower cost and less power consumption than a surface-emitting semiconductor laser that emits light in a direction parallel with a substrate. This is why the VCSEL has been drawing attentions.

The surface-emitting laser includes a current constriction layer that is formed by selectively oxidizing a selectively-oxidized layer to increase current injection efficiency.

Examples of application of such a surface-emitting laser in applied fields include a writing light source with, e.g., an oscillation wavelength of 780 nm for a writing system in printers and a writing light source with, e.g., oscillation wavelengths of 780 nm and 850 nm for reading and writing in optical disc devices. The surface-emitting lasers are expected to be applied to pump sources of solid-state lasers. In such a case, there is a demand for the surface-emitting lasers to have a lower threshold value and higher output power to be successfully applied to such devices.

SUMMARY

In an aspect of this disclosure, there is provided a surface-emitting laser including: an active layer, a spacer layer disposed on the active layer, and a reflection mirror disposed on the spacer layer, including a current constriction layer that is a selectively-oxidized layer. The current constriction layer is disposed at a position of a node of a standing-wave of an electric field of light oscillated at the active layer. The current constriction layer is disposed away from an interface between the spacer layer and the reflection mirror by an optical distance of one-fourth of an oscillation wavelength at the active layer. The selectively-oxidized layer is made of AlGaAs. The reflection mirror includes at least one AlGaInP layer contacting the selectively-oxidized layer.

In another aspect of this disclosure, there is provided a surface-emitting laser array including a plurality of surface-emitting lasers as described above.

In still another aspect of this disclosure, there is a laser device including the surface-emitting laser array as described above; and an optical system to guide a laser beam emitted from the surface-emitting laser array to a target.

In yet another aspect of this disclosure, there is provided an ignitor including the laser device as described above, and an optical system to collect and condense a laser beam emitted from the laser device.

In further aspect of this disclosure, there is provided an internal combustion engine including the ignitor as described above to ignite fuel to generate inflammable gas.

In still further aspect of this disclosure, there is provided an optical scanner including a scanning light source including the surface-emitting laser as described above, a light deflector to deflect light emitted from the scanning light source, and a scanning optical system to collect and condense the light deflected by the light deflector.

In yet further aspect of this disclosure, there is provided an image forming apparatus including an image bearer to bear an image, and an optical scanner as described above to scan the image bearer with light modulated according to data of the image.

Further described is an optical transmitter module including the surface-emitting laser array as described above and a drive device that drives the surface-emitting laser array to generate a light signal according to an input electrical signal.

Still further described is a light transmission system including the optical transmitter module as described above, a light transmission medium to transmit a light signal generated by the light transmission module, and a converter to convert the light signal sent from the light transmission medium into an electrical signal.

BRIEF DESCRIPTION OF THE DRAWINGS

The aforementioned and other aspects, features, and advantages of embodiments of the present disclosure will be better understood by reference to the following detailed description when considered in connection with the accompanying drawings, wherein:

FIG. 5 is an illustration of laminated semiconducting layers;

FIG. 17 is an illustration of a surface-emitting laser array according to the comparative example;

Figure 1A:
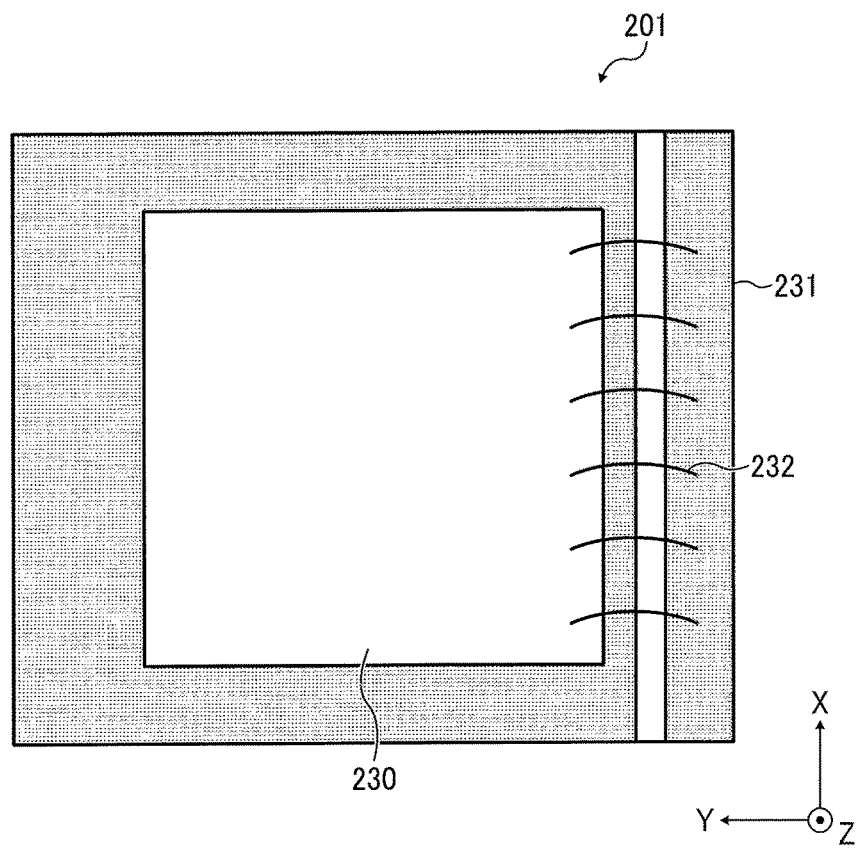
FIGS. 1A and 1B each is an illustration of a surface-emitting laser array according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

In the following description, an embodiment of the present disclosure is described with reference to the drawings.

Figure 1B:
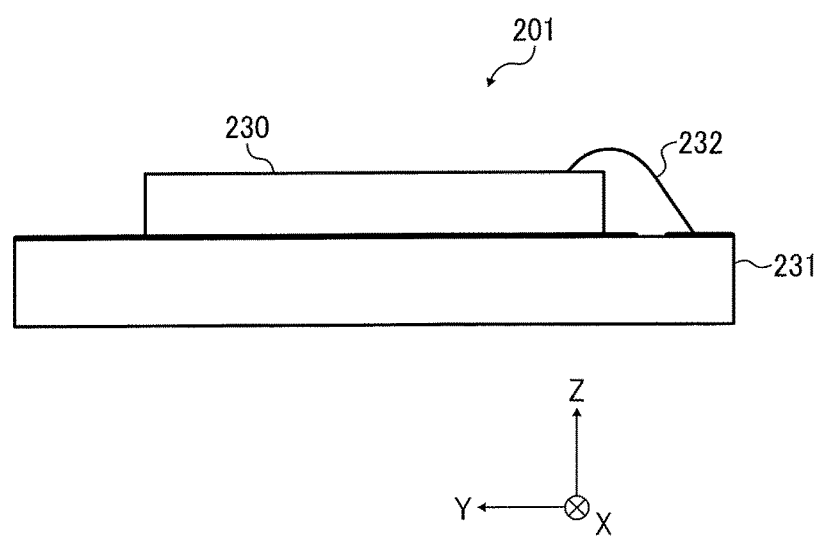

FIGS. 1A and 1B each is an illustration of a surface-emitting laser array 201 according to an embodiment of the present disclosure. The surface-emitting laser array 201 includes a surface-emitting laser array chip 230 and a heat-dissipative member 231. In the XYZ three-dimensional orthogonal coordinate system according to the present embodiment, it is assumed that the direction in which the surface-emitting laser array 201 emits light is the +Z direction.

Figure 2:
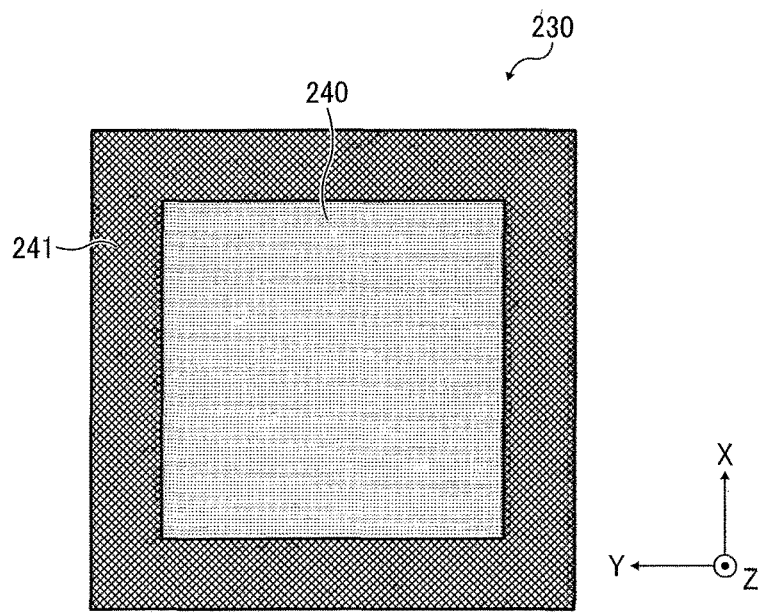
FIG. 2 is an illustration of a surface-emitting laser array chip according to an embodiment of the present disclosure.

As illustrated in FIG. 2, the surface-emitting laser array chip 230 includes a plurality of light-emitting units LE each as a surface-emitting laser and an electrode pad 241 that surrounds a light-emitting-unit area 240 in which the plurality of light-emitting units LE are formed.

Figure 3:
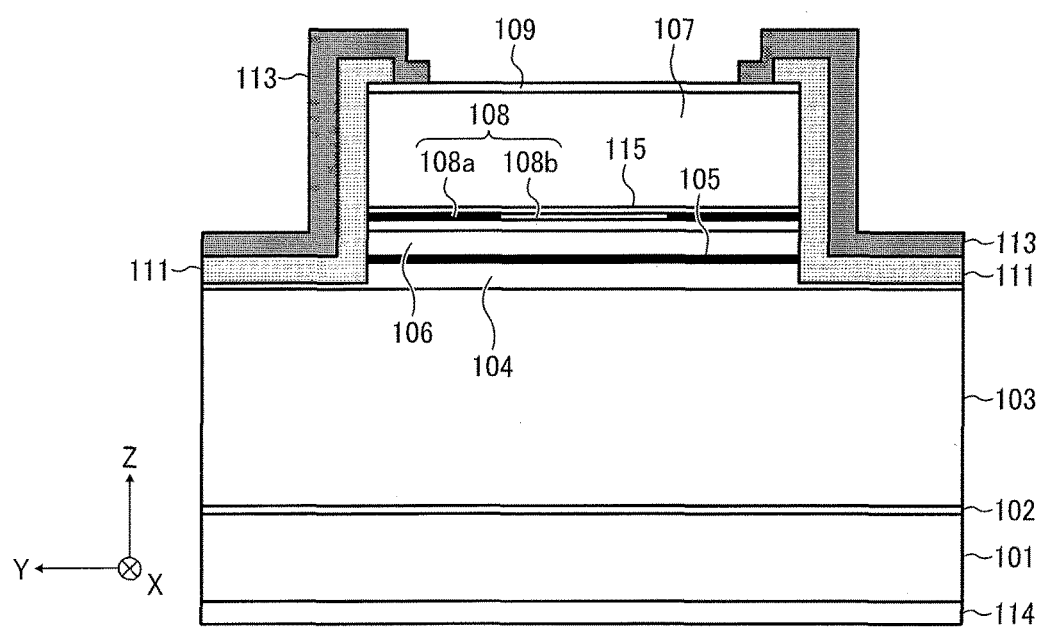
FIG. 3 is a section view of one light-emitting unit along the line Y-Z.

FIG. 3 is a section view of one light-emitting unit LE as a surface-emitting laser along the line Y-Z. Each light-emitting unit LE includes a substrate 101, a buffer layer 102, a lower semiconductor distributed Bragg reflector (DBR) 103, a lower spacer layer 104, an active layer 105, an upper spacer layer 106, an upper semiconductor DBR 107, a contact layer 109, a protective layer 111, an upper electrode 113, and a lower electrode 114.

Figure 4A:
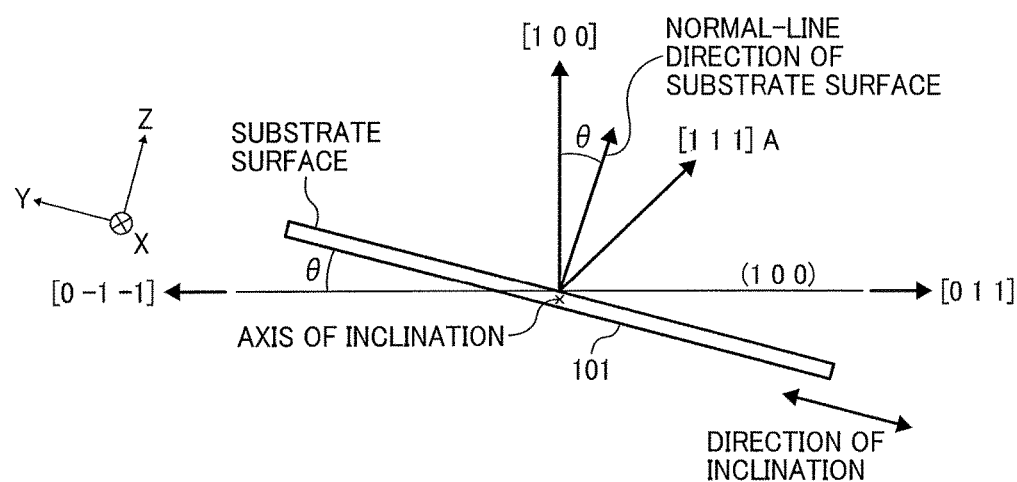
FIGS. 4A and 4B each is an illustration of a substrate according to an embodiment of the present disclosure.
Figure 4B:
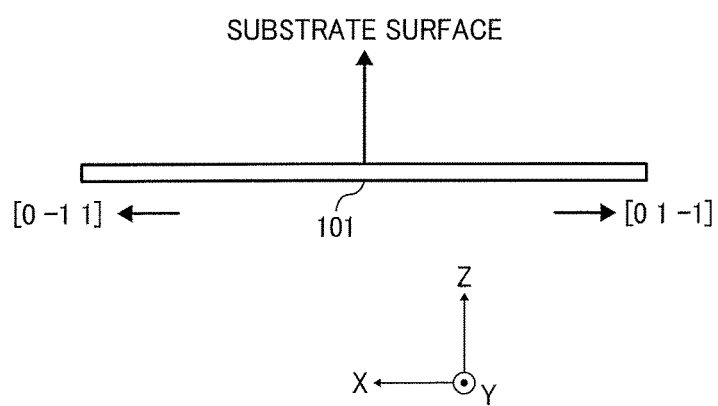

As illustrated in FIG. 4A, the substrate 101 is an n-GaAs single-crystal substrate where the normal-line direction of the surface of the substrate 101 is inclined toward a crystal orientation [1 1 1] A by 15 degrees ($\theta$=15 degrees) with respect to a crystal orientation [1 0 0]. In other words, the substrate 101 is so-called inclined substrate. In the present embodiment, as illustrated in FIG. 4B, the substrate 101 is disposed such that the crystal orientations [0 −1 1] and [0 1 −1] are the +X direction and the −X direction, respectively. In this case, the inclined axis of the substrate 101 is parallel to the X-axis direction. Note that, the direction perpendicular to both the normal-line direction and the inclined-axis direction of the surface of the substrate 101 is referred to as an "inclination direction". In the present embodiment, the Y-axis direction refers to the inclination direction.

Referring back to FIG. 3, the buffer layer 102 is composed of n-GaAs, and is stacked on the surface of the substrate 101 on the +Z side.

The lower semiconductor DBR 103 is stacked on the +Z-side surface of the buffer layer 102. The lower semiconductor DBR 103 includes 40.5 pairs of lower-low refractive index layers each of which is composed of n-$Al_{0.9}As_{0.1}$ and lower-high refractive index layers each of which is composed of n-$Al_{0.3}Ga_{0.7}As$. In this case, one lower-high refractive index layer is disposed on one lower-low refractive index layer to constitute each pair.

Between two layers of varying refractive indexes, a gradient-composition layer where the composition gradually changes from a side of the composition to the other side of the composition is provided to reduce the electrical resistance.

Each of the layers of varying refractive indexes is designed to include one-half of the adjacent gradient-composition layer and have an optical thickness of $\lambda/4$ when it is assumed that the oscillation wavelength is $\lambda$. Note that when the optical thickness is $\lambda/4$, the actual thickness of the layer is D=$\lambda/4n$ (where n denotes the refractive index of the medium of the layer).

The lower spacer layer 104 is stacked on the +Z side of the lower substrate DBR 103, and is composed of non-doped $(Al_{0.2}Ga_{0.8})_{0.5}In_{0.5}P$.

The active layer 105 is stacked on the lower spacer layer 104 on the +Z side. The active layer 105 has, e.g., a triple-bond quantum well structure composed of a three-layer quantum well layer and a four-layer blocking layer. Each quantum well layer is composed of, e.g., GaAs. Each blocking layer is composed of, e.g., $Al_{0.3}Ga_{0.7}As$.

The upper spacer layer 106 is stacked on the active layer 105 on the +Z side, and is a layer composed of non-doped $(Al_{x3}Ga_{1-x3})_{0.5}In_{0.5}P$, e.g., a layer composed of non-doped $(Al_{0.2}Ga_{0.8})_{0.5}In_{0.5}P$.

The portion consisting of the lower spacer layer 104, the active layer 105, and the upper spacer layer 106 is referred to as a resonator structure, and has the optical thickness of one wavelength. The active layer 105 is disposed in the center of the resonator structure to achieve a high stimulated-emission rate. Note that the center of the resonator structure corresponds to a belly of the standing-wave distribution of the electric field.

As illustrated in FIG. 5, the upper semiconductor DBR 107 as a reflection mirror is stacked on the +Z side of the upper spacer layer 106, and includes a first low refractive index layer 107c and 25 pairs of high refractive index layers 107b and second low refractive index layers 107a.

In the present embodiment, the second low refractive index layer 107a is composed of p-$Al_{0.9}Ga_{0.1}As$. The high refractive index layer 107b is composed of p-$Al_{0.3}Ga_{0.7}As$. In the present embodiment, the low refractive index layer 107c is composed of p-$(Al_{x2}Ga_{1-x2})_{0.5}In_{0.5}P$, e.g., p-$(Al_{0.5}Ga_{0.5})_{0.5}In_{0.5}P$. Hereinafter, a layer composed of p-$(Al_{x2}Ga_{1-x2})_{0.5}In_{0.5}P$ is also referred to as an "AlGaInP layer".

Between two layers of varying refractive indexes, a gradient-composition layer is provided. Each of the layers of varying refractive indexes is designed to include one-half of the adjacent gradient-composition layer and have an optical thickness of $\lambda/4$.

The upper semiconductor DBR 107 includes a selectively-oxidized layer (a layer selectively-oxidized) 108 with a thickness of 30 nm between the first low refractive index layer 107c and the second low refractive index layer 107a. In the present embodiment, the selectively-oxidized layer 108 is composed of p-$Al_{x1}Ga_{1-x1}As$ (0.95≤x1≤1), e.g., p-AlAs. The selectively-oxidized layer 108 is positioned at a node of the standing-wave distribution of the electric field, being disposed away from the active layer 105 by an optical distance of $3\lambda/4$.

An anti-oxidation layer 115 is stacked on the +Z side of the selectively-oxidized layer 108. In the present embodiment, the anti-oxidation layer 115 is composed of p-$Al_{0.7}Ga_{0.3}As$.

The first low refractive index layer 107c, the selectively-oxidized layer 108, the anti-oxidation layer 115, and the second low refractive index layer 107a that is first disposed on the anti-oxidation layer 115 constitute a layer with an optical thickness of $3\lambda/4$ (refer to FIG. 5).

The contact layer 109 is stacked on the +Z side of the upper semiconductor DBR 107, and is composed of p-GaAs.

In the present embodiment, the protective layer 111 is composed of silicon mononitride (SiN), silicon nitrogen oxide SiON, or silicon dioxide ($SiO_2$).

The upper electrode 113 is formed on the protective layer 111 and a part of the contact layer 109.

The lower electrode 114 is formed on the back side (the −Z-side surface) of the substrate 101.

Note that in the following description, the product of a plurality of semiconducting layers stacked on the substrate 101 as described above is referred to simply as a layered product.

Figure 7A:
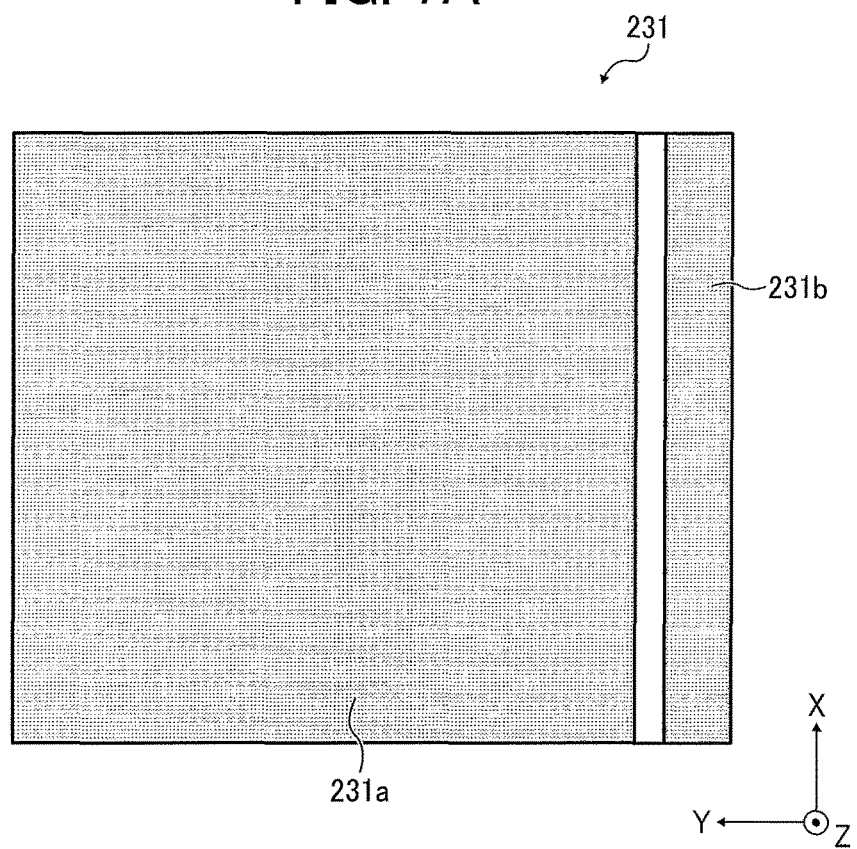
FIGS. 7A and 7B each is an illustration of a heat-dissipative member according to an embodiment of the present disclosure.
Figure 7B:
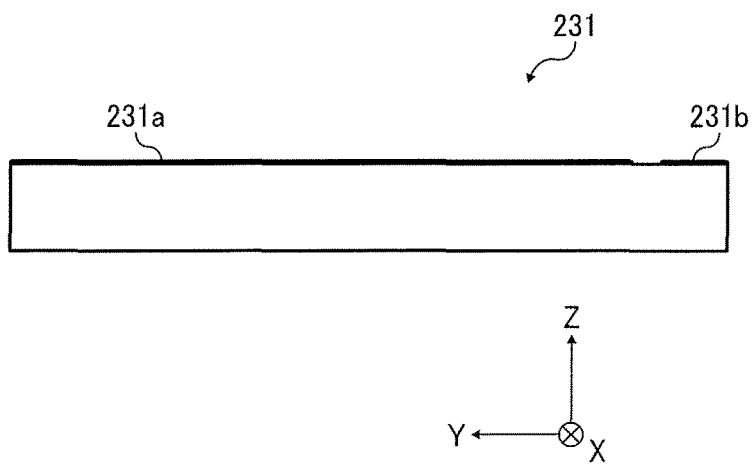

As illustrated in FIG. 7A and FIG. 7B, a heat-dissipative member 231 is comprised of aluminum nitride (AlN), having a first pattern 231a and a second pattern 231b formed on the surface on the +Z side. The first pattern 231a and the second pattern 231b are made of gold (Au), having a thickness of 1 μm. The first pattern 231a and the second pattern 231b are not electrically connected to each other.

Next, a method of manufacturing the surface-emitting laser array 201 is described.

Figure 8:
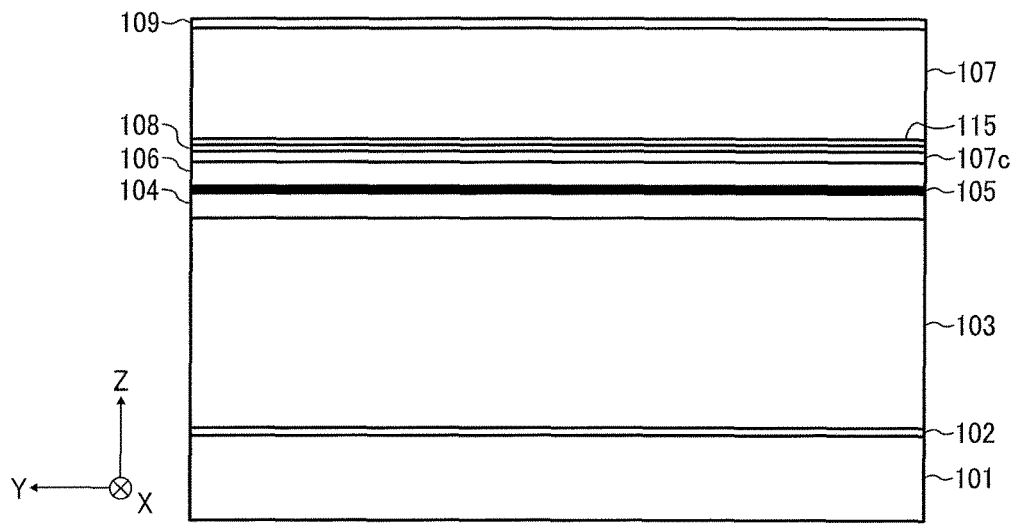
FIG. 8 is an illustration of a manufacturing method of the surface-emitting laser array according to an embodiment of the present disclosure.

(1) The above-described layered product is formed by crystal growth using the metal-organic chemical vapor deposition (MOCVD) or the molecular beam epitaxy (MBE) (refer to FIG. 8). Hereinafter, cases in which the MOCVD is employed are described.

In the MOCVD, trimethylgallium (TMG) is used as a gallium (Ga) material, trimethylaluminum (TMA) used as an aluminum (Al) material, trimethylindium (TMI) used as an indium (In) material, arsine (AsH$_3$) used as an arsenic (As) material, and phosphine (PH$_3$) used as a phosphorus (P) material.

In this case, hydrogen selenide (H$_2$Se) is used as an n-type dopant material in AlGaAs layer, and carbon tetrabromide (CBr$_4$) is used as a p-type dopant material in AlGaAs layer. Moreover, dimethyl zinc (DMZn) is used as a p-type dopant material in the AlGaInP layer.

(2) On the surface of the layered product, a resist pattern in a mesa shape is formed in an array. Specifically, a photoresist coating is applied onto the contact layer 109, and the coated layer is subjected to exposure and development processes by an exposure device so that a square-shaped resist pattern in a mesa shape with a side of 25 µm is formed.

(3) The inductively coupled plasma (ICP) dry etching is adopted, and a quadrangular-prism mesa is formed using the above-described resist pattern as a photomask.

Figure 9:
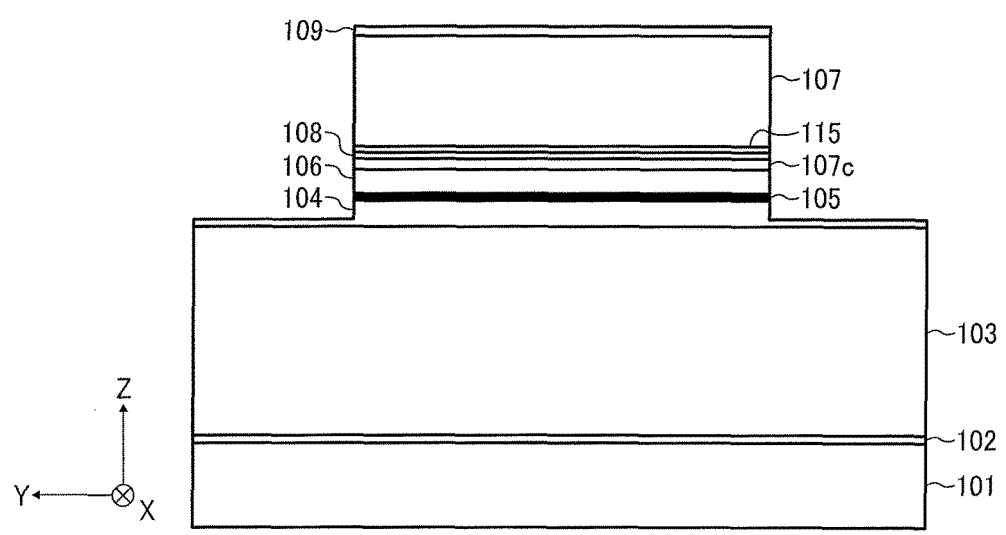
FIG. 9 is an illustration of a manufacturing method of the surface-emitting laser array according to another embodiment of the present disclosure.

(4) The resist pattern is eliminated (refer to FIG. 9).

Figure 10:
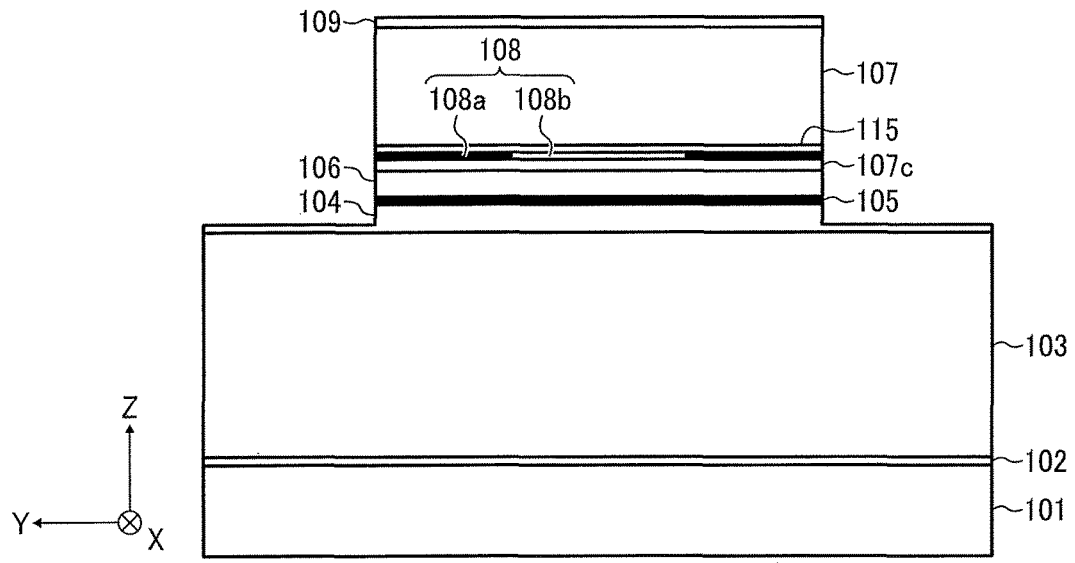
FIG. 10 is an illustration of a manufacturing method of the surface-emitting laser array according to another embodiment of the present disclosure.

(5) The layered product is heated up in the vapor. In the present embodiment, aluminum (Al) in the selectively-oxidized layer 108 is selectively oxidized from the periphery of the mesa, thereby forming a current constriction layer. In this configuration, a non-oxidized area 108b that is surrounded by an oxidized layer 108a of Al is left non-oxidized in the center of the mesa (refer to FIG. 10). As a result, an oxidation constriction structure as a current constriction layer is formed that limits the path of the driving current of the light-emitting units (LE) to the center of the mesa. The above-described non-oxidized area 108b is a current-carrying area (current injection area). Note that, the anti-oxidation layer 115 and the first low refractive index layer 107c prevent or reduce the oxidization of the adjacent layers.

(6) A resist pattern is formed by lithography such that a peripheral groove-forming part and an area to be electrically separated from an array in the following process are exposed to outside.

(7) A separating groove is formed using the ICP dry etching.

Figure 12:
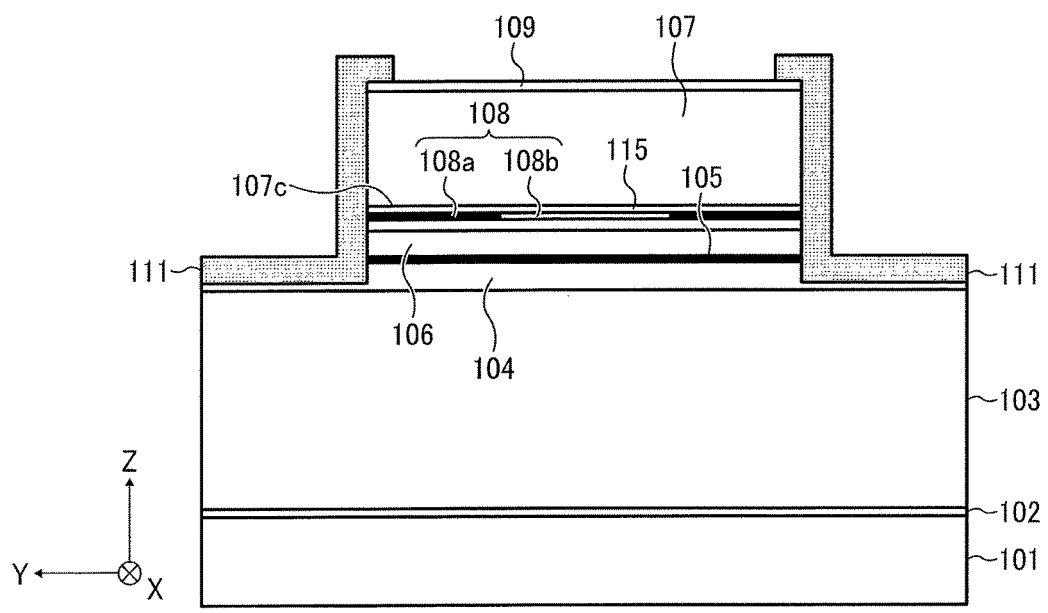
FIG. 12 is an illustration of a manufacturing method of the surface-emitting laser array according to another embodiment of the present disclosure.

(8) The resist pattern is eliminated (refer to FIG. 12).

(9) The layered product is placed in the chamber to be heated for three minutes at temperatures ranging from 380° C. through 400° C. under a nitrogen atmosphere. Accordingly, natural oxidized film due to oxygen or water adhering to the surface or a trace level of oxygen and water in the chamber is formed to be a more stable passivation film.

Figure 11:
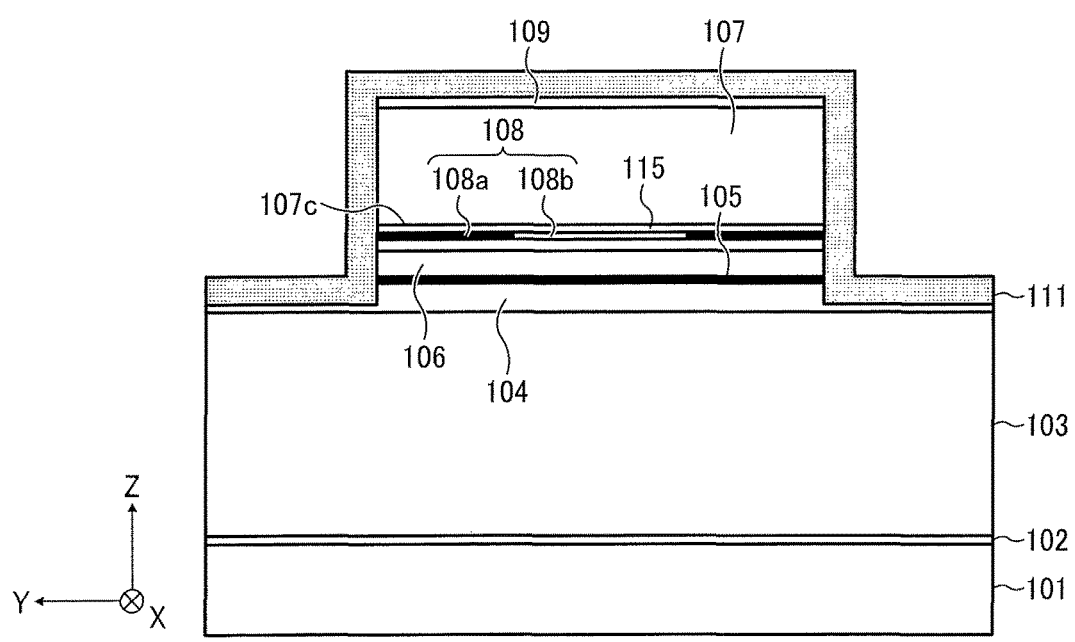
FIG. 11 is an illustration of a manufacturing method of the surface-emitting laser array according to another embodiment of the present disclosure.

(10) The chemical vapor deposition (plasma CVD) is used to form the protective layer 111 made of SiN, SiON, or SiO$_2$ (refer to FIG. 11).

(11) A resist pattern is manufactured to form a contact hole on the top surface of the mesa.

(12) The protective layer 111 is removed from the opening of the resist pattern by wet etching using buffered hydrogen fluoride (BHF). At this time, the protective layer 111 is also removed from an area to be scribed on the bottom of the separating groove formed in (7).

(13) The resist pattern is eliminated (refer to FIG. 12).

(14) At an area on the upper part of the mesa that servers as a light-exiting portion, a square-shaped resist pattern with a side of 10 µm and a resist pattern that connects the electrode pad 241 with the light-emitting unit LE are formed.

(15) A material of the upper electrode 113 is prepared on the protective layer 111 and the contact layer 109 by evaporation. In the present embodiment, metal films composed of titanium (Ti), platinum (Pt), and Au, respectively are sequentially laminated on the protective layer 111 and the contact layer 109 by electron beam (EB) vapor deposition.

Figure 13:
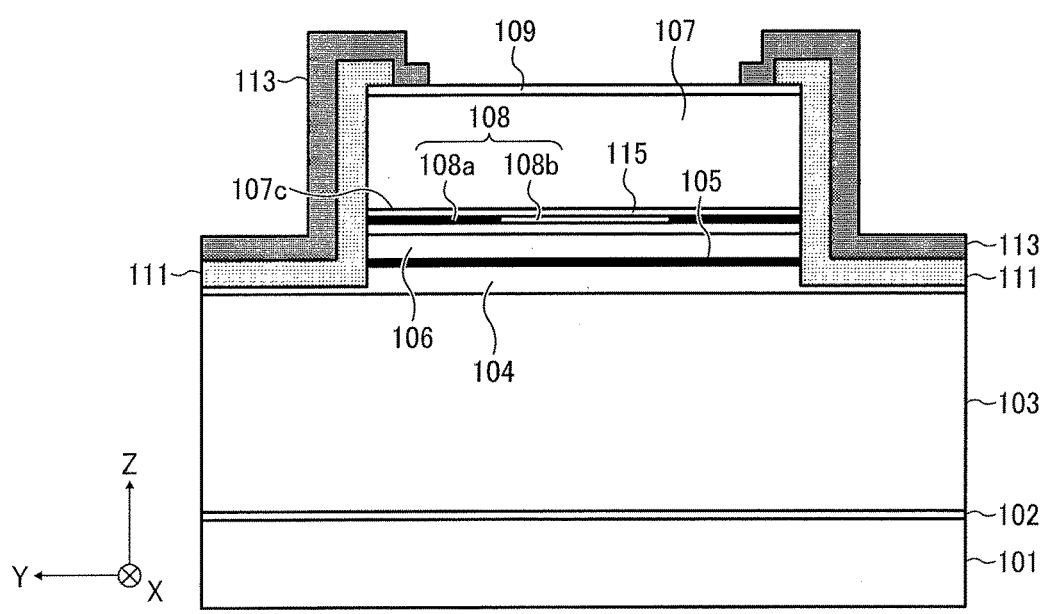
FIG. 13 is an illustration of a manufacturing method of the surface-emitting laser array according to another embodiment of the present disclosure.

(16) The metal film formed on the resist pattern is removed by a lift-off process to obtain the upper electrode 113 (refer to FIG. 13).

Figure 14:
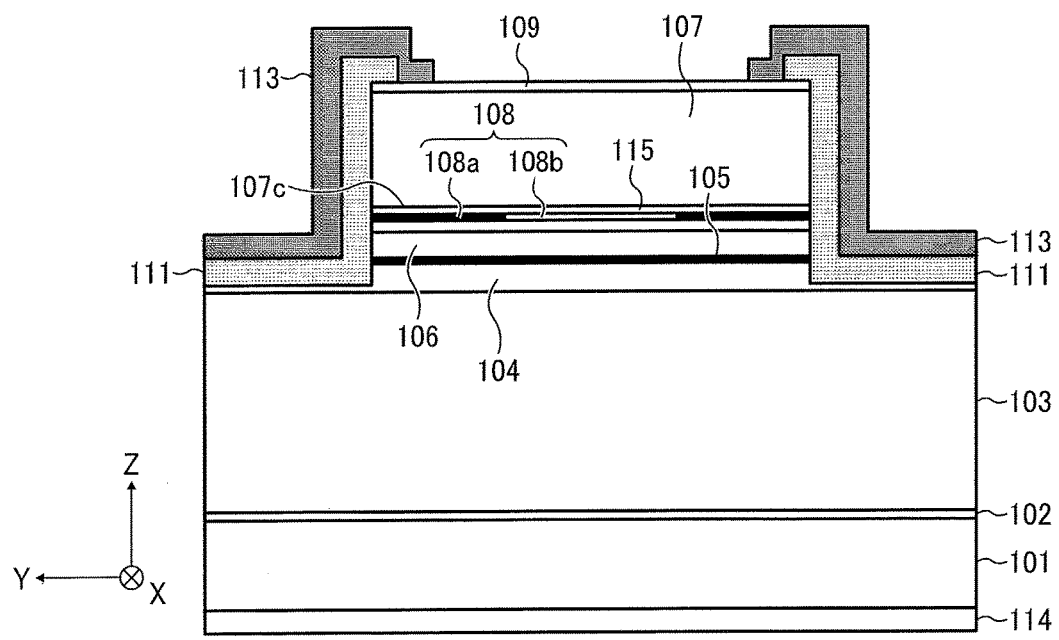
FIG. 14 is an illustration of a manufacturing method of the surface-emitting laser array according to another embodiment of the present disclosure.

(17) The back side of the substrate 101 is polished to a predetermined thickness (for example, approximately 100 µm), and metal films made of AuGe, nickel (Ni), and Au, respectively are sequentially laminated on the back side of the substrate 101 by EB vapor deposition so that the lower electrode 114 is formed (refer to FIG. 14).

(18) Annealing is conducted for five minutes at a temperature of 400° C. to achieve the ohmic conduction between the upper electrode 113 and the lower electrode 114. Accordingly, the mesa serves as the light-emitting unit LE.

(19) The layered product with mesa is cut into chips using the scribe-brake method. Thus, a surface-emitting laser array chip 230 is manufactured.

Figure 15A:
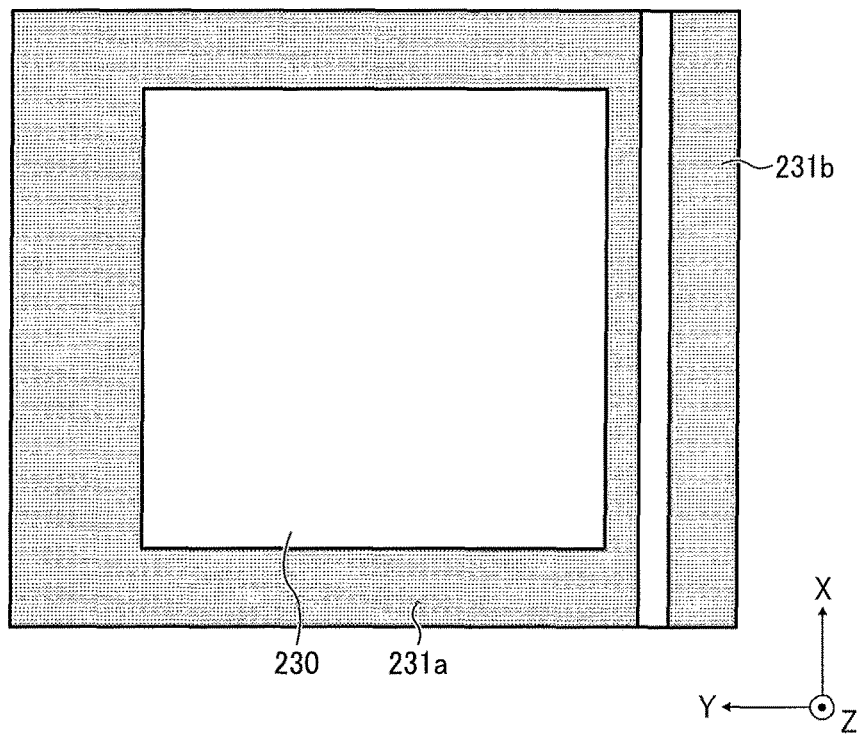
FIGS. 15A and 15B each is an illustration of a surface-emitting laser array chip and a heat-dissipative member that joint together according to an example embodiment of the present disclosure.
Figure 15B:
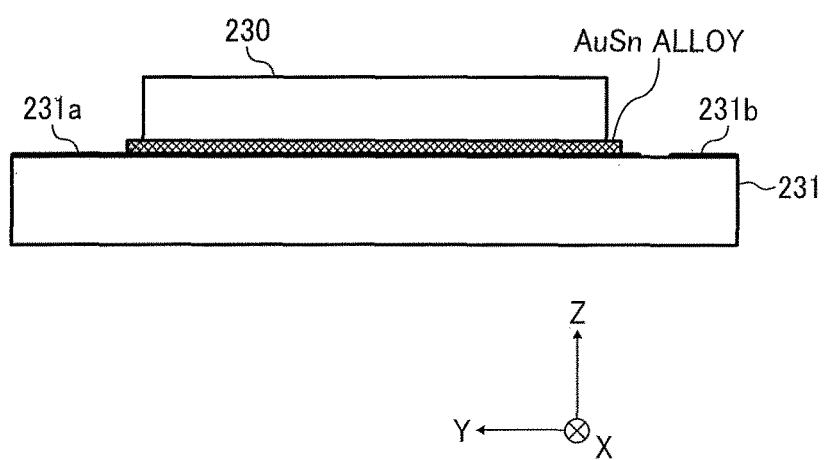

(20) The heat-dissipative member 231 and the surface-emitting laser array chip 230 are joined together with AuSn alloy in a plate heated up to a temperature ranging from 200° C. through 250° C. In the present embodiment, the AuSn alloy film with a thickness of 3 µm is formed on the first pattern 231a. The surface-emitting laser array chip 230 is positioned on the AuSn alloy film (refer to FIGS. 15A and 15B). In such a case, an appropriate amount of load is applied to obtain a sufficient junction between the AuSn alloy film and the entire surface of the surface-emitting laser array chip 230.

Figure 16A:
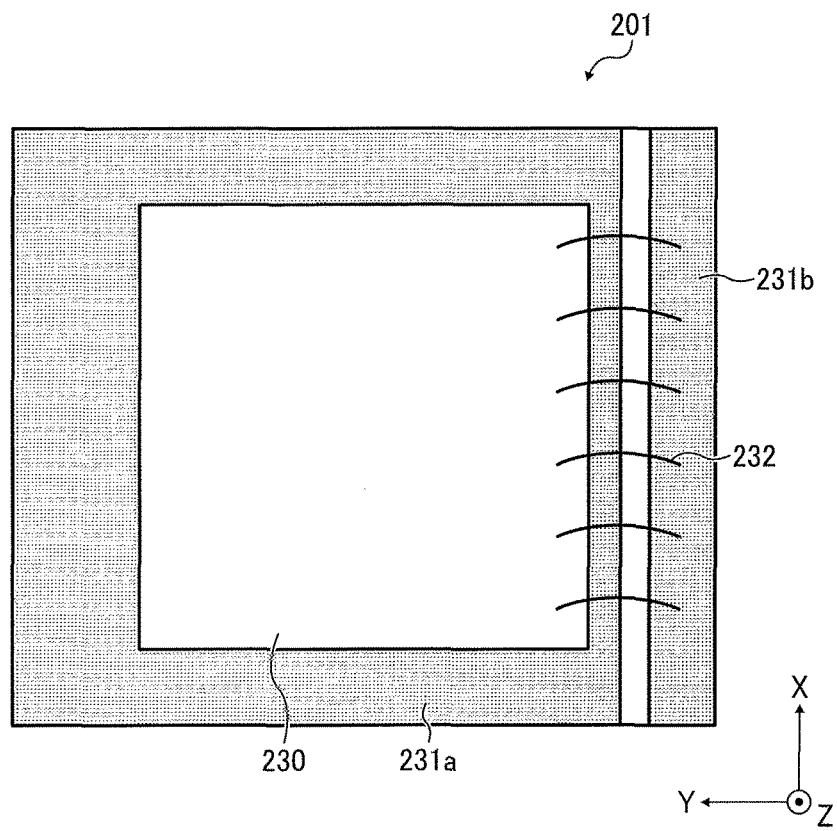
FIGS. 16A and 16B each is an illustration of wire bonding of the surface-emitting laser array and the heat-dissipative member.
Figure 16B:
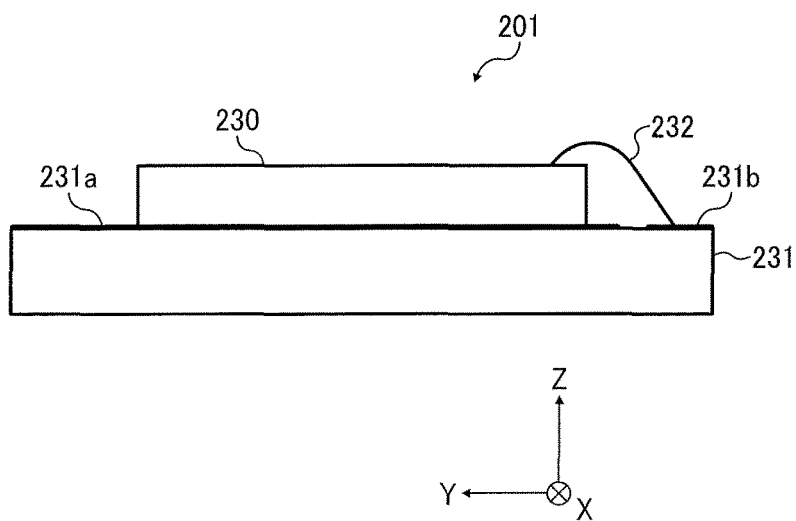

(21) A wiring member 232 made of Au is used to electrically connect the upper electrode 113 and the second pattern 231b (refer to FIG. 16).

Thus, the surface-emitting laser array 201 is manufactured.

Note that, to achieve a lower threshold value in the surface-emitting laser, the optical thickness is preferably $\lambda/4$ from the selectively-oxidized layer 108 to the interface between the upper spacer layer 106 and the upper semiconductor DBR 107 when the surface-emitting laser has an oscillation wavelength of $\lambda$. In this case, the selectively-oxidized layer 108 is positioned at a node of the standing-wave distribution of the electric field, in the low refractive index layer of the upper semiconductor DBR 107 that is closest to the active layer 105.

However, in typical surface-emitting lasers in which a selectively-oxidized layer is disposed closer to an active layer, the heat generation occurs due to valence band discontinuities among a selectively-oxidized layer of $Al_{x4}Ga_{1-x4}As$ ($0.95 \leq x4 \leq 1$), an anti-oxidation layer of $Al_{0.7}Ga_{0.3}As$, a low refractive index layer of $Al_{0.9}Ga_{0.1}As$ of an upper semiconductor DBR, and an upper spacer layer of $Al_{0.6}Ga_{0.4}As$. Such heat generation might increase the temperature of the active layer to reduce the output level of the surface-emitting laser, resulting in a decrease in reliability.

Figure 6:
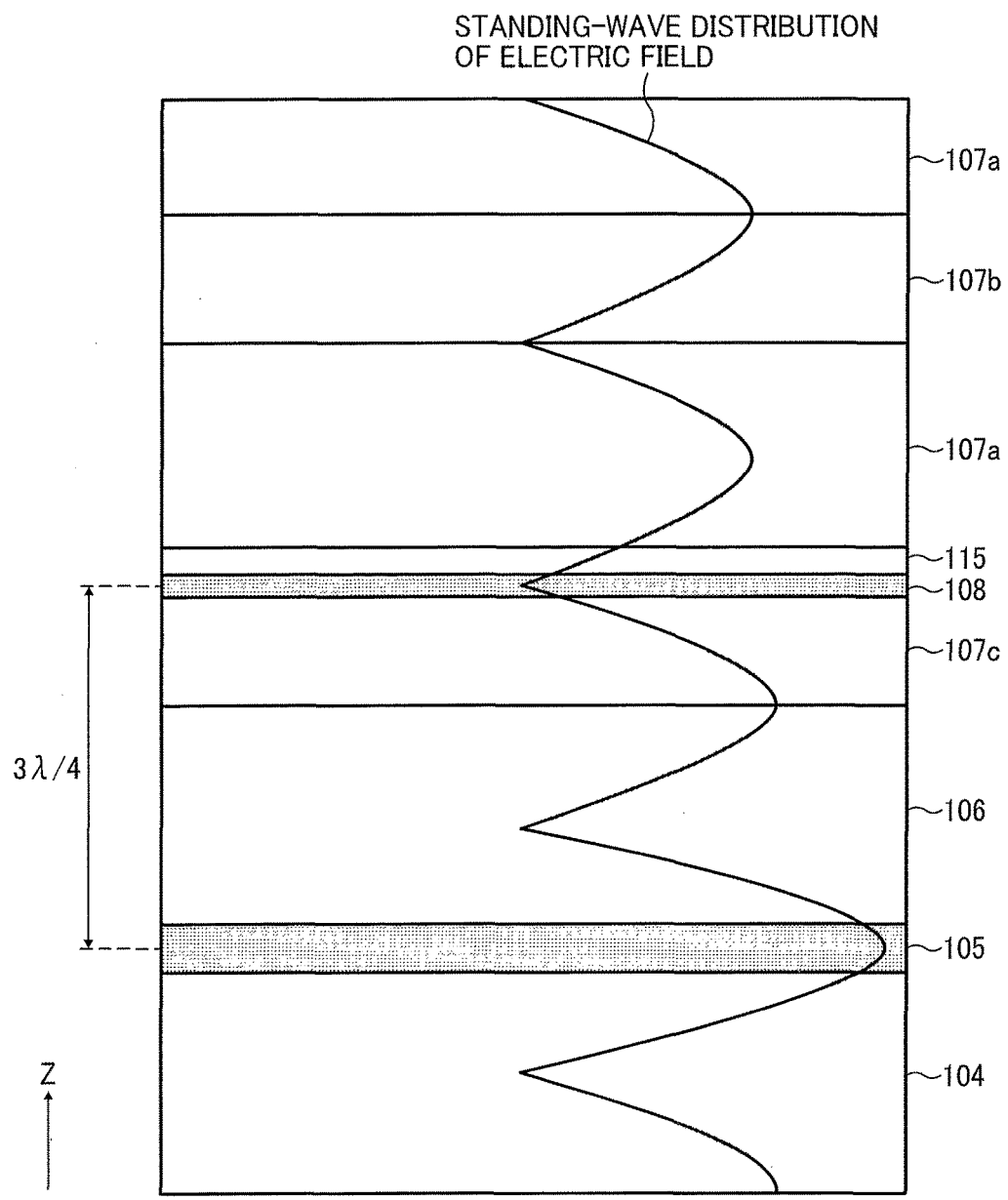
FIG. 6 is an illustration of standing-wave distribution of an electric field according to an embodiment of the present disclosure.

In the present embodiment, the AlGaInP layer is disposed on the +Z-side of the upper spacer layer 106 as the first low refractive index layer 107c of the upper semiconductor DBR 107. The AlGaInP layer serves in the same manner as the anti-oxidation layer 115 does. In this configuration, the selectively-oxidized layer 108 is disposed at a position of a node of the standing-wave distribution of the electric field (refer to FIG. 6), being distant from the interface between the upper spacer layer 106 and the upper semiconductor DBR 107 by an optical thickness of $\lambda/4$ (refer to FIG. 5).

Such a configuration allows current to be injected into the active layer 105 before the constricted current spreads again in the current constriction structure, thus achieving a lower threshold value for oscillation and preventing or reducing invalid current.

With the selectively-oxidized layer 108 being disposed at a node of the standing-wave distribution of the electric field, light scattering loss is reduced, thus reducing a threshold value of current.

In such a case, AlGaInP is used for the material of the first low refractive index layer 107c instead of AlGaAs, thereby reducing the valance band discontinuity, thus reducing the resistance in heterointerface. This configuration prevents or reduces the heat generation of the surface-emitting laser, and also prevents or reduces an increase in temperature of the active layer 105 even with the selectively-oxidized layer 108 close to the active layer 105, thus increasing the output power and reliability of the surface-emitting laser.

The surface-emitting laser array 201, in which the surface-emitting lasers are aggregated with high density, provides higher output power. The surface-emitting laser array 201 reduced in size still provides output power equal to that of the typical surface-emitting laser array.

FIG. 17 is an illustration of the relation of the configuration ranging from the lower spacer layer 1104 through the upper semiconductor DBR 1107 and the standing-wave of the electric field, in a surface-emitting laser according to a comparative example. According to the comparative example of FIG. 17, on the +Z side of an active layer 1105 are disposed $Al_{0.6}Ga_{0.4}As$ layer as an upper spacer layer 1106, $Al_{0.9}Ga_{0.1}As$ layer as a low refractive index layer 1107a of an upper semiconductor DBR, $Al_{0.7}Ga_{0.3}As$ layer as an anti-oxidation layer 1115, $Al_{x4}Ga_{1-x4}As$ ($0.95 \leq x4 \leq 1$) layer as a selectively-oxidized layer 1108, $Al_{0.7}Ga_{0.3}As$ layer as another anti-oxidation layer 1115, and $Al_{0.3}Ga_{0.7}As$ layer as an anti-oxidation layer 1115, and $Al_{0.3}Ga_{0.7}As$ layer as a high refractive index layer 1107b of the upper semiconductor DBR, in the recited order.

By contrast, in the present embodiment, on the +Z side of the active layer 105 are disposed $(Al_{x3}Ga_{1-x3})_{0.5}In_{0.5}P$ layer as the upper spacer layer 106, $(Al_{x2}Ga_{1-x2})_{0.5}In_{0.5}P$ layer as the first low refractive index layer 107c of the upper semiconductor DBR 107, $Al_{x1}Ga_{1-x1}As$ ($0.95 \leq x1 \leq 1$) layer as the selectively-oxidized layer 108, $Al_{0.7}Ga_{0.3}As$ layer as the anti-oxidation layer 115, $Al_{0.9}Ga_{0.1}As$ layer as the low refractive index 107a of the upper semiconductor DBR 107, and $Al_{0.3}Ga_{0.7}As$ layer as the high refractive index layer 107b of the upper semiconductor DBR 107, in the recited order.

Figure 18:
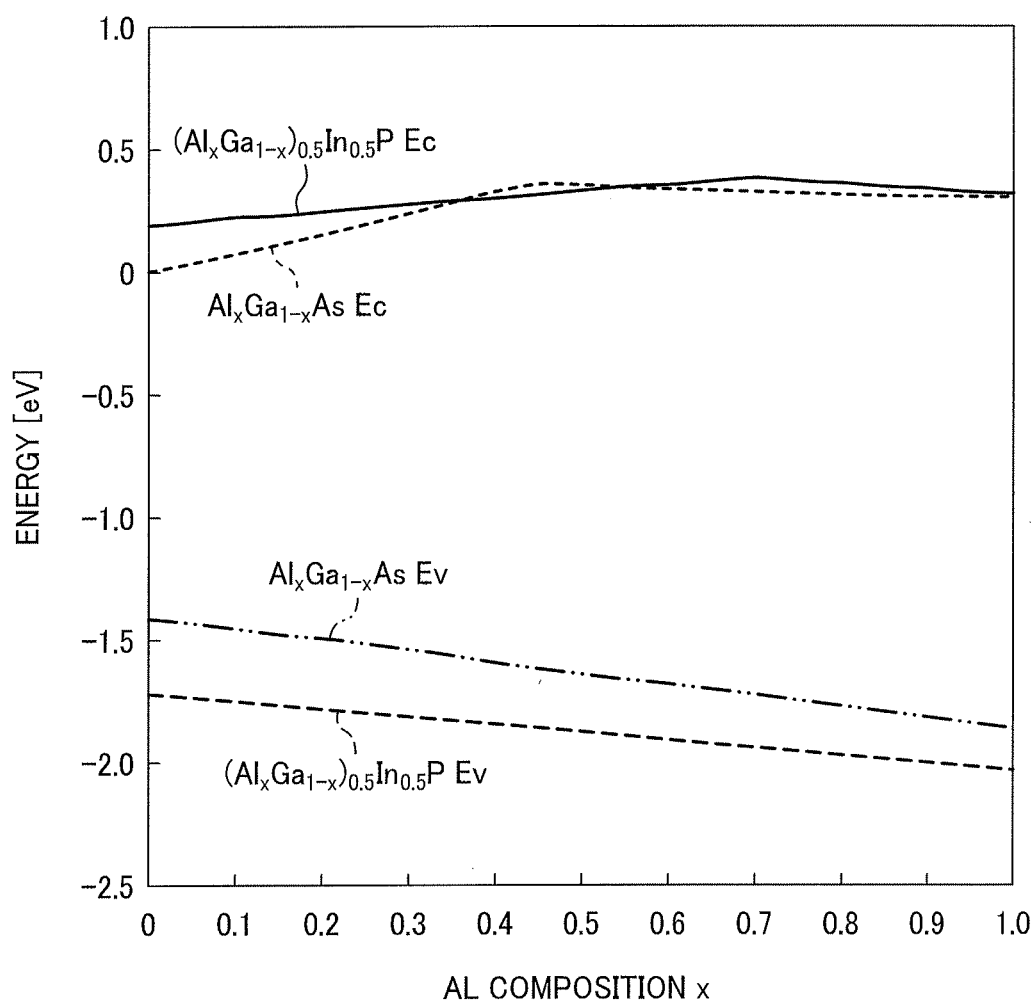
FIG. 18 is an illustration of the relation of Al composition and band gap energy in $(Al_xGa_{1-x})_{0.5}In_{0.5}P$ and $Al_xGa_{1-x}As$.

FIG. 18 is a graph of the relation of Al composition x in $(Al_xGa_{1-x})_{0.5}In_{0.5}P$ and $Al_xGa_{1-x}As$ relative to energy Ec of conduction band and energy Ev of valence band. Referring to FIG. 18, with the configuration of the comparative example in which the $Al_{0.7}Ga_{0.3}As$ layer is used as the active layer 1105 and the AlAs layer is used as the selectively-oxidized layer 1108, the valence band continuity is 134 [meV].

As illustrated in FIG. 18, when the $(Al_{x2}Ga_{1-x2})_{0.5}In_{0.5}P$ layer, instead of the $Al_{0.7}Ga_{0.3}As$ layer, is used as the anti-oxidation layer 115, the valence band discontinuity amount is approximately 0 [meV] with Al content of about 0.4.

For band gap energy, the $Al_{0.9}Ga_{0.1}As$ layer as the second low refractive index layer 107a of the upper semiconductor DBR 107 has a band gap energy of 212 [meV], while the $(Al0.4Ga_{0.6})_{0.5}In_{0.5}P$ layer as the first low refractive index layer 107c of the upper semiconductor DBR 107 has a band gap energy of 215 [meV]. That is, the surface-emitting laser according to the present embodiment of this disclosure reduces valence band discontinuity amount and increases band gap energy as compared to the surface-emitting laser according to the comparative example.

With an increase in band gap energy of a low refractive index layer adjacent to a spacer layer, an overflow of electrons from the spacer layer is prevented or reduced, thereby increasing resistivity and blocking carrier transport.

In the present embodiment, the AlGaInP layer is disposed on the selectively-oxidized layer 108 only on the side of the active layer 105.

Such a configuration in which the AlGaInP layer (the first low refractive index layer 107c) is disposed on the selectively-oxidized layer 108 only on the side of the active layer 105 prevents or reduces heat generation of the surface-emitting laser. In such a case, As layers are stacked on the selectively-oxidized layer 108 in +Z direction, which advantageously facilitates stacking layers to constitute the upper semiconductor DBR 107.

Further, the selectively-oxidized layer 108 is disposed at a note of the standing-wave distribution of the electric field, the position of which is distant from the upper spacer layer 106 by an optical distance of λ/4. The second low refractive index layer 107a of the upper semiconductor DBR 107 is disposed such that the optical distance is n λ/4 (n is a natural number) from the center of the selectively-oxidized layer 108 to the +Z-side surface of the second low refractive index layer 107a at a node of the standing-wave distribution of the electric field. Accordingly, the gradient-composition layer is disposed at the interface between the second low refractive index layer 107a and the high refractive index layer 107b, thereby reducing the resistance at heterointerface.

In the present embodiment, AlGaInP layer is used as the first low refractive index layer 107c toward the active layer 105 of the selectively-oxidized layer 108, and AlGaAs layer is used as the second low refractive index layer 107a toward the light-exiting portion of the selectively-oxidized layer 108. Thus, the semiconductor DBR ranging from the selectively-oxidized layer 108 to the light-exiting surface is all composed of AlGaAs.

In manufacturing a selective-oxidative surface-emitting laser, etching is performed to render the sides of a selectively-oxidized layer exposed to outside so that the selectively-oxidized layer is selectively oxidized. In such a etching process, exposed portions and unexposed portions of the sides may occur due to in-plane anisotropy of etching, which lowers a yield in the oxidization process.

In general, chlorine gas is used for etching. Indium (In) chloride offers a low steam pressure, having difficulty in separating reactive substances from the etching surface, so that an etching rate decreases.

In the present embodiment, the material for the semiconductor DBR ranging from the selectively-oxidized layer 108 to the light-exiting surface is composed of AlGaAs that does not contain Indium (In). The material for the layers disposed toward the active layer 105 from the selectively-oxidized layer 108 is composed of AlGaInP that contains Indium.

With such a configuration, the etching anisotropy that occurs in etching the AlGaAs material disappears when an etching-bottom surface reaches the AlGaInP material, resulting in a successful in-plane uniform etching. As a result, the entirety of the end faces of the selectively-oxidized layer 108 are reliably exposed to outside, thus achieving a high yield.

Figure 19:
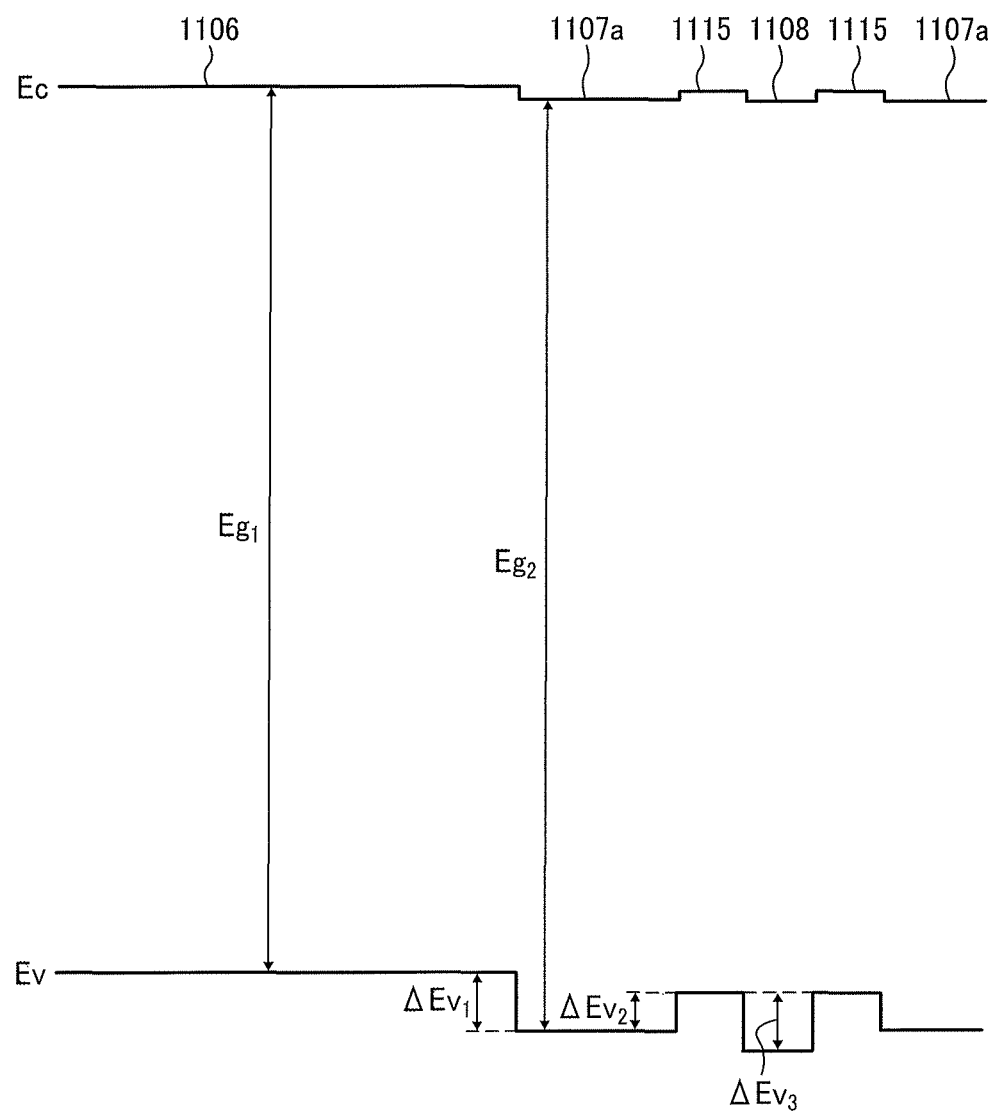
FIG. 19 is an illustration of a band structure ranging from an upper spacer layer to a selectively-oxidized layer in the surface-emitting laser according to the comparative example.

FIG. 19 is an illustration of a band structure ranging from the upper spacer layer 1106 to the selectively-oxidized layer 1108 in the surface-emitting laser according to the comparative example. FIG. 19 represents energy Ec of conduction band in each layer and energy Ev of valence band in each band.

$Eg_1$ refers to the band gap of the upper spacer layer 1106 and $Eg_2$ refers to the band gap of the low refractive index layer 1107a of the upper semiconductor DBR. Specifically, $Eg_2-Eg_1$ is 102 meV.

$\Delta Ev_1$ refers to a band discontinuity amount between the upper spacer layer 1106 and the low refractive index layer 1107a of the upper semiconductor DBR in the valence band. $\Delta Ev_2$ refers to a band discontinuity amount between the low refractive index layer 1107a of the upper semiconductor DBR and the anti-oxidation layer 1115. $\Delta Ev_3$ refers to a band discontinuity amount between the anti-oxidation layer 1115 and the selectively-oxidized layer 1108.

Specifically, when the selectively-oxidized layer 108 is made of AlAs, $\Delta Ev_1$ is 134 meV, $\Delta Ev_2$ of 89 meV, and $\Delta Ev_3$ of 134 meV. In addition, when the selectively-oxidized layer 108 is made of $Al_{0.95}Ga_{0.05}As$. $\Delta Ev_1$ is 134 meV, $\Delta Ev_2$ of 89 meV, and $\Delta Ev_3$ of 112 meV.

Figure 20:
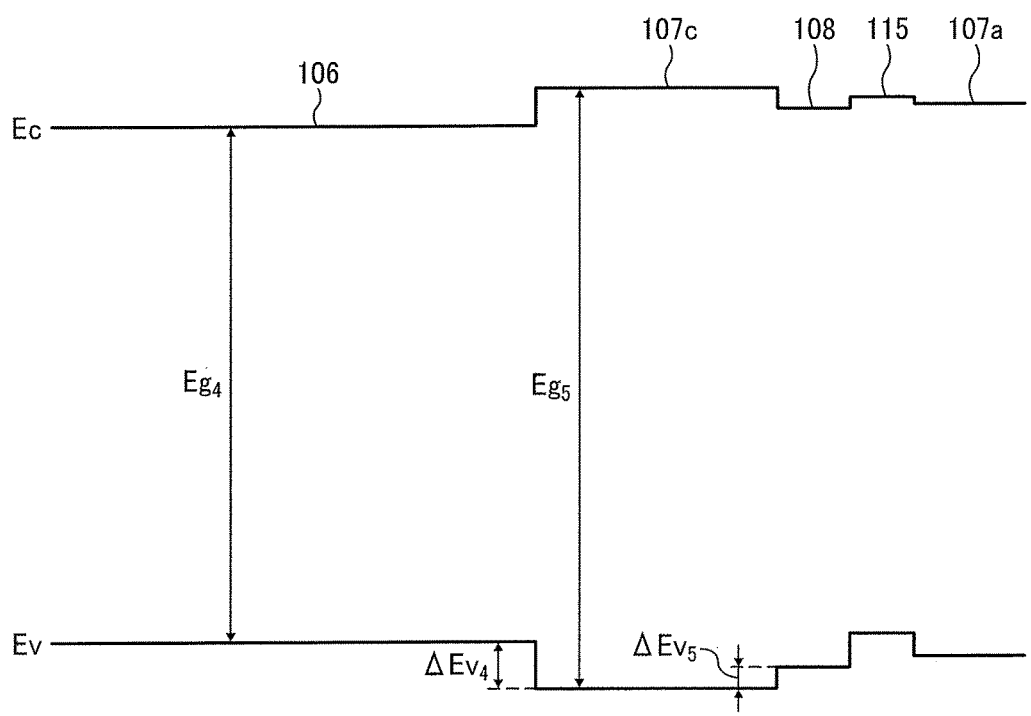
FIG. 20 is an illustration of a band structure ranging from an upper spacer layer to a selectively-oxidized layer in the surface-emitting laser according to the present embodiment of this disclosure.

FIG. 20 is an illustration of a band structure ranging from the upper spacer layer 106 to the selectively-oxidized layer 108 in the surface-emitting laser according to the present embodiment.

$Eg_4$ refers to the band gap of the upper spacer layer 106 and $Eg_5$ refers to the band gap of the first low refractive index layer 107c of the upper semiconductor DBR.

$\Delta Ev_4$ refers to valence band discontinuity between the upper spacer layer 106 and the first low refractive index layer 107c of the upper semiconductor DBR. $\Delta Ev_5$ refers to a band discontinuity amount between the first low refractive index layer 107c of the upper semiconductor DBR and the selectively-oxidized layer 108.

Figure 21:
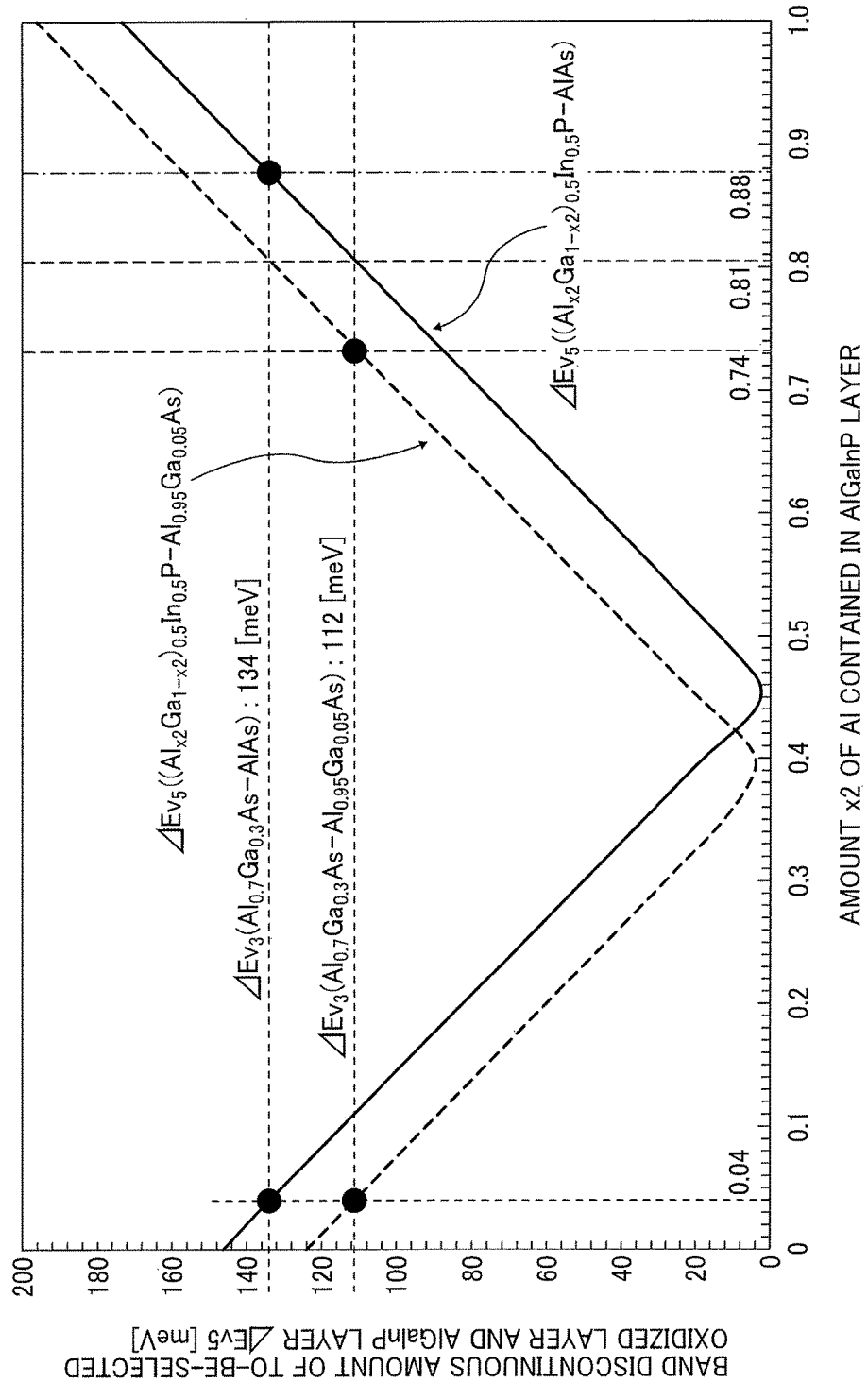
FIG. 21 is an illustration of the relation of Al composition x2 and $\Delta Ev_5$ when the first refractive index layer of FIG. 20 is composed of $(Al_{x2}Ga_{1-x2})_{0.5}In_{0.5}P$.

FIG. 21 is an illustration of the relation of Al composition x2 and $\Delta Ev_5$ when the first low refractive index layer 107c of FIG. 20 is composed of $(Al_{x2}Ga_{1-x2})_{0.5}In_{0.5}P$. FIG. 21 represents the selectively-oxidized layer 108 composed of $Al_{0.95}Ga_{0.05}As$ and composed of AlAs.

Referring to FIG. 21, the ranges in which the values of $\Delta Ev_5$ are smaller than the values of $\Delta Ev_3$ are observed. Note that, in the comparative example, when the selectively-oxidized layer 1108 is composed of AlAs, $\Delta Ev_3$ is 134 meV; and when the selectively-oxidized layer 1108 is composed of $Al_{0.95}Ga_{0.05}As$, $\Delta Ev_3$ is 112 meV.

The mark "black point" in FIG. 21 represents a point at which the band discontinuity amount in the valence band (valence band discontinuity amount) according to the present embodiment coincides that of the comparative example. In the ranges in which the values of $\Delta Ev_5$ are smaller than the values of $\Delta Ev_3$, the minimum value of Al content x2 is fixed at 0.04. The maximum value of Al content x2 depends on Al content x1 of the selectively-oxidized layer 108 ($Al_{x1}Ga_{1-x1}As$ ($0.95 \leq x1 \leq 1$). The ranges are expressed using x1.

In the coordination, the x-coordinate and the y-coordinate denotes Al content x2 and the band discontinuity amount, respectively. For example, when x2 is 0.74 and the band discontinuity amount is 112 meV, the coordination is (0.74, 112).

The point at which the value of $\Delta Ev_5$ coincides with the value of $\Delta Ev_3$ lies on the straight line that connects the coordinate (0.74, 112) and the coordinate (0.88, 134). The locations of the points depend on Al content x1 in the selectively-oxidized layer 108 ($Al_{x1}Ga_{1-x1}As$ ($0.95 \leq x1 \leq 1$).

With changes in x1 from 0.95 to 1, x2 changes from 0.74 to 0.88. This is expressed by the following mathematical expression (1):

$$x=(0.88-0.74/1.00-0.95)(x1-1.00)+0.88 \approx 2.80 \times x1 - 1.92 \quad (1).$$

A value x that is determined by the above-described expression (1) represents a point at which the value of $\Delta Ev_5$ coincides with the value of $\Delta Ev_3$. Thus, the values of x2 is set to be lower than the values of x determined by the above-described expression (1) so that the values of $\Delta Ev_5$ are smaller than the values of $\Delta Ev_3$.

The range of the values of x2 is expressed by the following expression (2):

$$0.04 \leq x2 \leq 2.80x1-1.92 \quad (2),$$

where $0.95 \leq x1 \leq 1$.

Selecting a value of x2 to satisfy the above-described expression (2) reduces a band continuity amount between the selectively-oxidized layer and the $(Al_{x2}Ga_{1-x2})_{0.5}In_{0.5}P$ layer, as compared to that of the comparative example. As a result, the surface-emitting laser according to the present embodiment prevents or reduces the heat generation and obtains a low threshold value without inducing a reduction in lifetime and output power.

Figure 22:
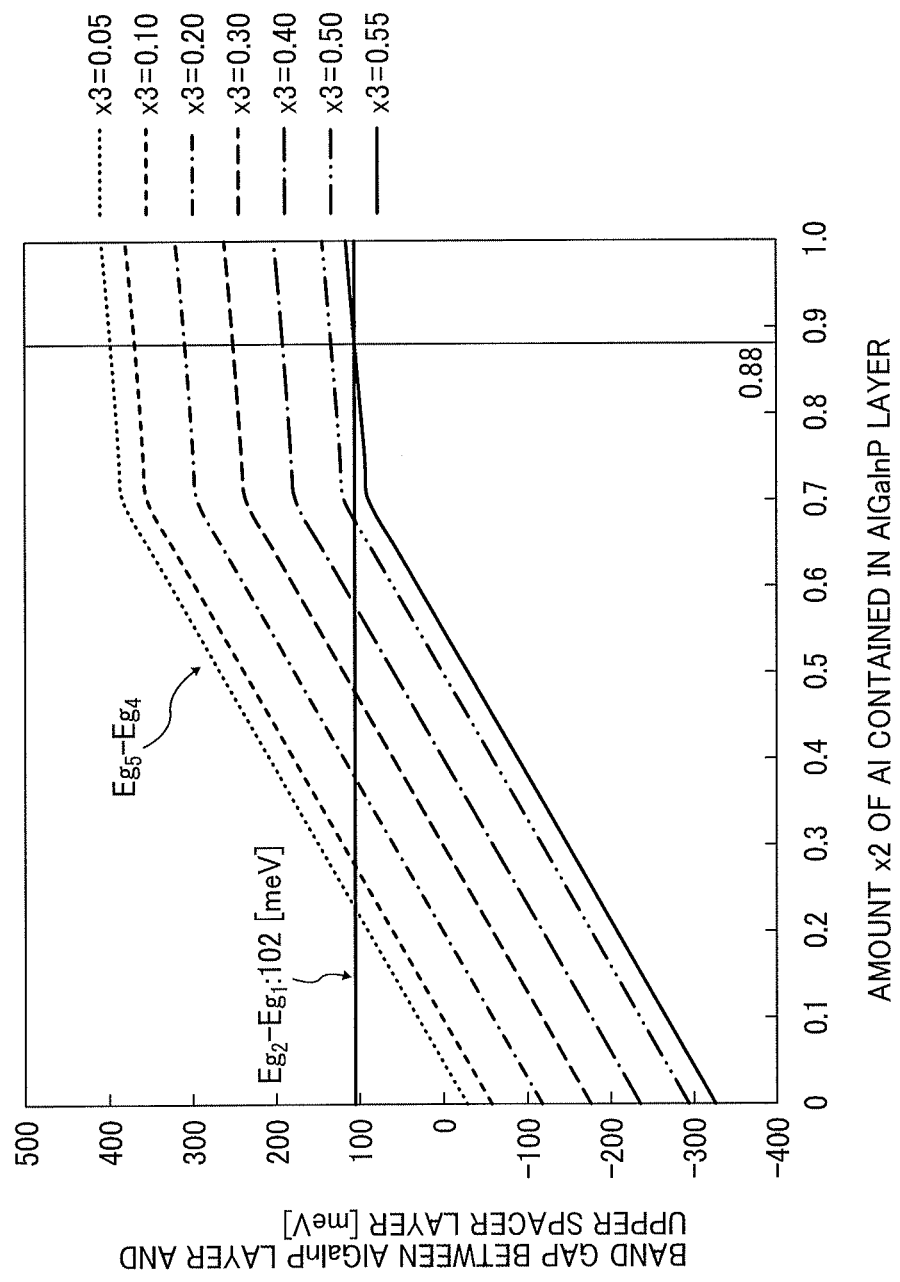
FIG. 22 is a graph of the difference $Eg_5-Eg_4$ in band gap between the upper spacer layer and an $(Al_{x2}Ga_{1-x2})_{0.5}In_{0.5}P$ layer with changes in Al content x2 in the $(Al_{x2}Ga_{1-x2})_{0.5}In_{0.5}P$ layer, relative to Al content x3 in an $(Al_{x3}Ga_{1-x3})_{0.5}In_{0.5}P$ layer.

FIG. 22 is a graph of the difference $Eg_5-Eg_4$ in band gap between the upper spacer layer 106 and the $(Al_{x2}Ga_{1-x2})_{0.5}In_{0.5}P$ layer with changes in Al content x2 in the $(Al_{x2}Ga_{1-x2})_{0.5}In_{0.5}P$ layer, relative to Al content x3 in the $(Al_{x3}Ga_{1-x3})_{0.5}In_{0.5}P$ layer. In FIG. 22, the horizontal axis denotes Al content x2 in the $(Al_{x2}Ga_{1-x2})_{0.5}In_{0.5}P$ layer, and the vertical axis denotes $Eg_5-Eg_4$.

To increase output power of the surface-emitting laser, electrons are preferably confined to an active layer. The $(Al_{x2}Ga_{1-x2})_{0.5}In_{0.5}P$ layer is also involved in confining electrons, as the upper spacer layer 106 does. Accordingly, the difference in band gap between the upper spacer layer 106 and the $(Al_{x2}Ga_{1-x2})_{0.5}In_{0.5}P$ layer 107c according to the present embodiment is increased, as compared to that of the upper spacer layer 1106 and the low refractive index layer 1107a of the upper semiconductor DBR according to the comparative example. This increases the confinement of electrons to the active layer 105, thus increasing the output power of the surface-emitting laser.

The band gap $Eg_2-Eg_1$ in the comparative example is 102 [meV]. Accordingly, increasing the value of the difference in band gap $Eg_5-Eg_4$ to be greater than 102 [meV] increases the confinement of electrons to the active layer 105, as compared to that of the comparative example, thus increasing output power of the surface-emitting laser according to the present embodiment.

In this case, the band continuity amount $\Delta Ev_5$ between the selectively-oxidized layer 108 and the $(Al_{x2}Ga_{1-x}2)_{0.5}In_{0.5}P$ layer is restricted to be lower than the band continuity amount $\Delta Ev_3$ according to the comparative example. In other words, the value of Al content x2 is preferably set to be less than or equal to 0.88.

According to FIG. 22, when the value of x3 ranges from 0.05 to 0.50, the difference in band gap $Eg_5-Eg_4$ exceeds 102 [meV] with changes in x2. For example, when x3 is 0.40, the difference in band gap is 102 [meV] with x2 of 0.55. When x2 is less than 0.55, the difference in band gap decreases as compared to that of the comparative example.

To obtain an advantage over the comparative example, a restriction is imposed on x2 determined by the above-described expression (2), and Al content x3 in the upper spacer layer 106 ($(Al_{x3}Ga_{1-x3})_{0.5}In_{0.5}P$ layer) may be selected within the range of 0≤x3≤0.55 in the present embodiment. In addition, Al content x2 and x3 may be selected within the range in which $Eg_5-Eg_4$ (the difference in band gap between the upper spacer layer 106 and the $(Al_{x2}Ga_{1-x2})_{0.5}In_{0.5}P$ layer) exceeds 102 [meV] in the present embodiment.

Thus, the difference in band gap between the upper spacer layer 106 and the low refractive index layer (the first low refractive index layer 107c) successfully increases as compared to that of the comparative example. Further, the heat generation that occurs between the selectively-oxidized layer 108 and the $(Al_{x2}Ga_{1-x2})_{0.5}In_{0.5}P$ layer is prevented or reduced as compared to the comparative example.

That is, the surface-emitting laser according to the present embodiment of this disclosure reduces valence band discontinuity amount and increases band gap energy as compared to the surface-emitting laser according to the comparative example. Thus, the surface-emitting laser array that achieves low threshold value and higher output power is manufactured.

Figure 23:
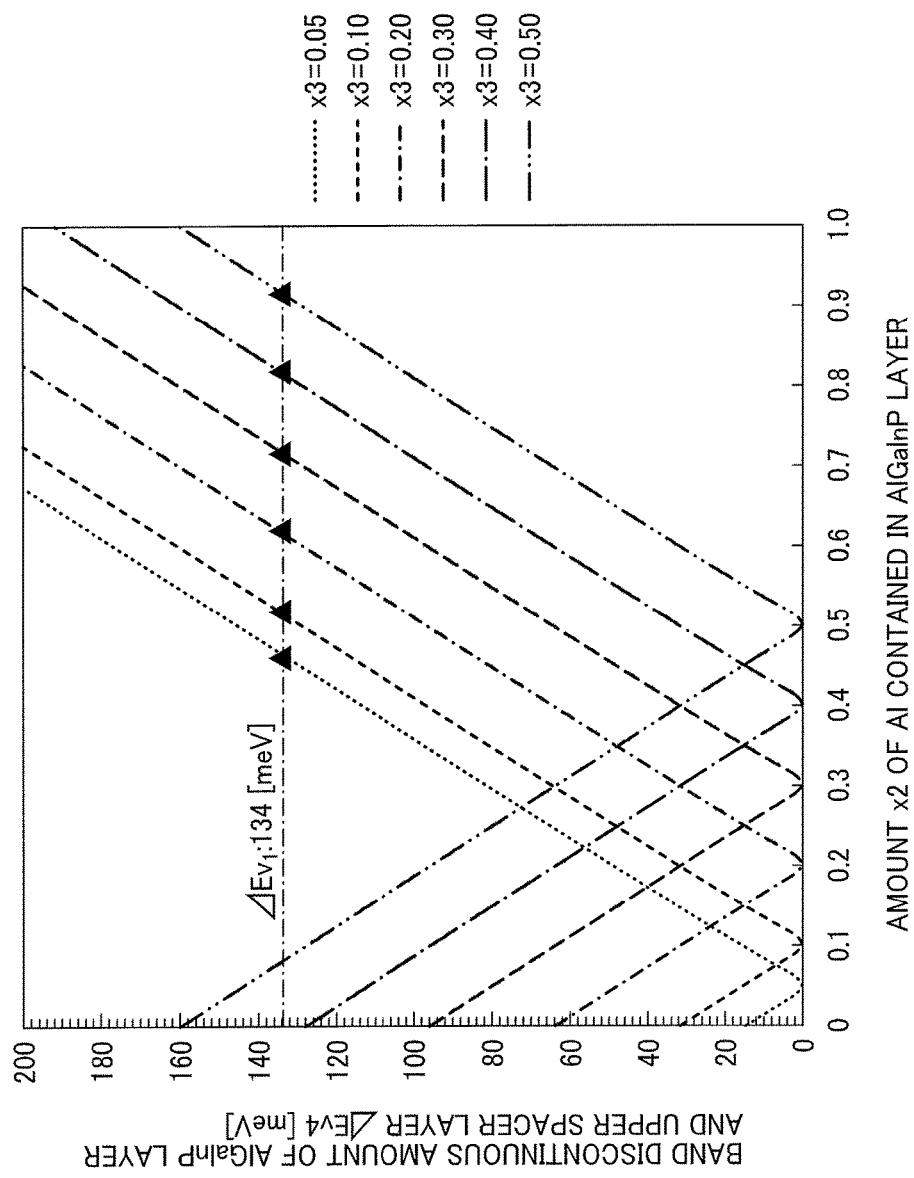
FIG. 23 is a graph of the valence band discontinuity amount of the upper spacer layer 106 and the $(Al_{x2}Ga_{1-x2})_{0.5}In_{0.5}P$ layer with changes in Al content x2 in the $(Al_{x2}Ga_{1-x2})_{0.5}In_{0.5}P$ layer, relative to Al content x3 in the upper spacer layer $((Al_{x3}Ga_{1-x3})_{0.5}In_{0.5}P$ layer)

FIG. 23 is a graph of the valence band discontinuity amount of the upper spacer layer 106 and the $(Al_{x2}Ga_{1-x2})_{0.5}In_{0.5}P$ layer with changes in Al content x2 in the $(Al_{x2}Ga_{1-x2})_{0.5}In_{0.5}P$ layer, relative to Al content x3 in the upper spacer layer $((Al_{x3}Ga_{1-x3})_{0.5}In_{0.5}P$ layer).

In FIG. 23, the vertical axis denotes $\Delta Ev_4$, and the lateral axis denotes Al content x2 in the $(Al_{x2}Ga_{1-x2})_{0.5}In_{0.5}P$ layer.

To reduce the heat generation between the upper spacer layer 106 and the AlGaInP layer 107c as compared to the comparative example, $\Delta Ev_4$ may be reduced as compared to $\Delta Ev_1$ of 134 [meV] in the comparative example.

In FIG. 23, black up-pointing triangles represent points at each of which the value $\Delta Ev_4$ is 134 [meV] relative to x3. Referring to FIG. 23, when the value of x2 is smaller than the value of a black up-pointing triangle, the value of $\Delta Ev_4$ is reduced to be smaller than 134 [meV].

Figure 24:
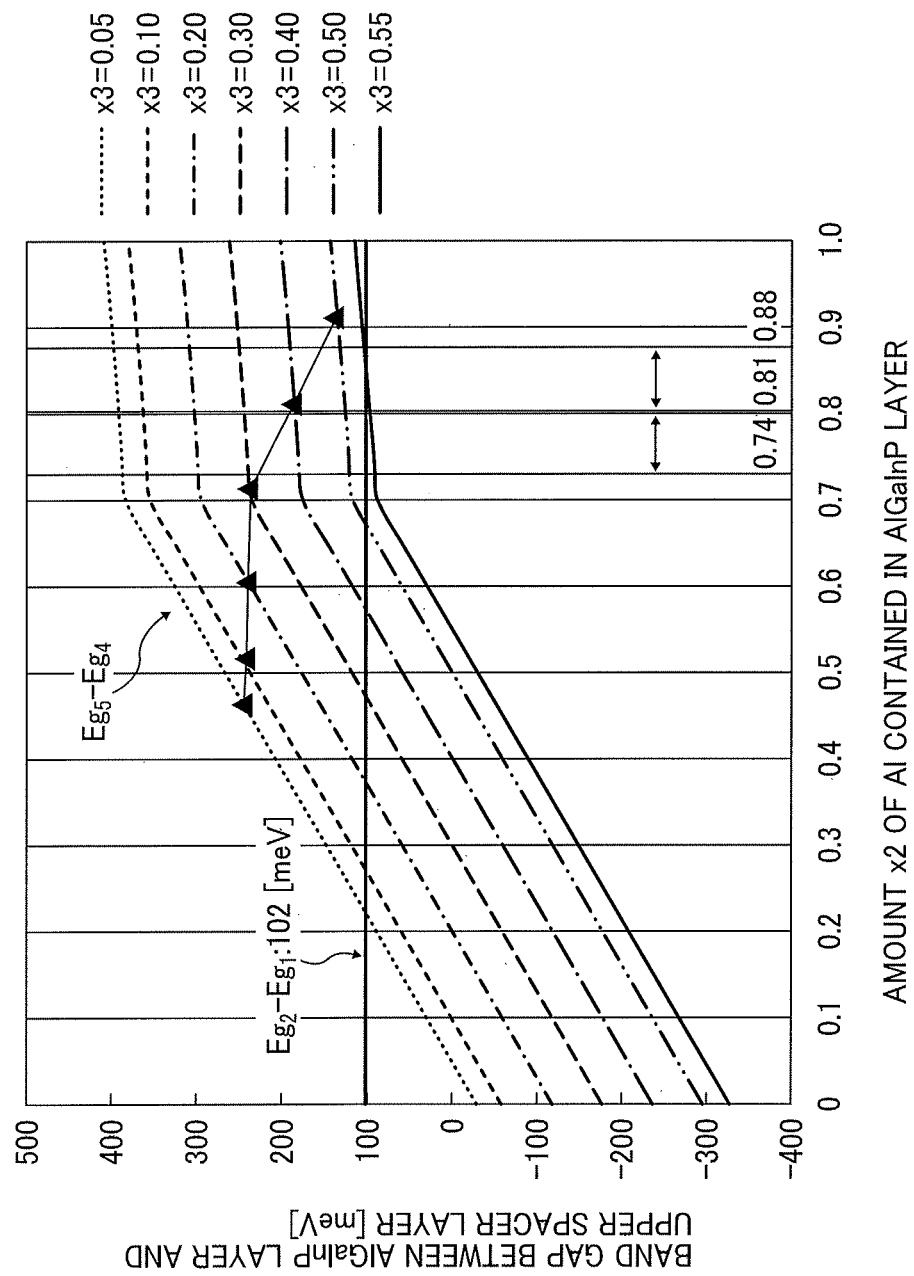
FIG. 24 is a graph of the difference $Eg_5-Eg_4$ in band gap between the upper spacer layer and the $(Al_{x2}Ga_{1-x2})_{0.5}In_{0.5}P$ layer with changes in Al content x2 in the $(Al_{x2}Ga_{1-x2})_{0.5}In_{0.5}P$ layer, relative to Al content x3 in the $(Al_{x3}Ga_{1-x3})_{0.5}In_{0.5}P$ layer.

FIG. 24 is a graph of the difference in band gap between the upper spacer layer 106 $((Al_{x3}Ga_{1-x3})_{0.5}In_{0.5}P$ layer) and the AlGaIn P layer.

In FIG. 24, black up-pointing triangles represent points of x2 at each of which the value of $\Delta Ev_4$ is 134 [meV]. Selecting a value of x2 within the range of smaller than the values of the black up-pointing triangles reduces the value of $\Delta Ev_4$ to be smaller than the value of $\Delta Ev_1$.

The band discontinuity $\Delta Ev_5$ between the AlGaInP layer 107c and the selectively-oxidized layer and the band discontinuity $\Delta Ev_4$ between the upper spacer layer 106 and the AlGaINP layer 107c are successfully reduced as compared to the band discontinuity amount of the comparative example when all of the following conditions are satisfied: (1) $Eg_5-Eg_4$ is greater than or equal to 102 [meV], (2) Al content x3 of the upper spacer layer 106 is less than or equal to 0.55, (3) Al content x2 in the AlGaInP layer 107 falls within the range in which $\Delta Ev_4$ is 134 [meV] (Al content x2 is smaller than the values of x2 indicated by the black up-pointing triangles in FIG. 24), and (4) Al content x2 in the AlGaInP layer 107c satisfies the above-described expression (2).

Selecting Al composition for each layer within such a range prevents or reduces the heat generation at layers ranging from the upper spacer layer 106 through the selectively-oxidized layer 108, increasing the confinement of electrons to the active layers 105. Thus, the surface-emitting laser array that achieves low threshold value and higher output power is obtained.

As described above, in the surface-emitting laser array 201 according to the present embodiment, each light-emitting unit LE includes the selectively-oxidized layer 108 that is composed of AlGaAs and is disposed at a position of a node of the standing-wave of the electric field of the oscillation wavelength. The node is distant from the interface between the upper spacer layer 106 and the upper semiconductor DBR 107 by an optical distance λ/4 when the oscillation wavelength is λ. In the present embodiment, the AlGaInP layer 107c is disposed on the selectively-oxidized layer 108.

In such a case, the AlGaInP layer 107c serves as both an anti-oxidation layer and a low refractive index layer of an upper semiconductor DBR 107. Further, the valence band discontinuity that ranges from the active layer 105 to the selectively-oxidized layer 108 is reduced. With the selectively-oxidized layer 108 disposed on the first low refractive index layer 107c (AlGaINP layer) of the upper semiconductor DBR 107 that is closest to the active layer 105, the effect of the heat generation on the properties of the surface-emitting laser is successfully reduced. This increases the confinement of electrons to the active layer 105, thus increasing the output power of the surface-emitting layer. Such a configuration achieves both a lower threshold value and higher output power of the surface-emitting laser.

In the present embodiment, the inclined substrate is employed as the substrate 101. The use of the inclined substrate allows for a successful glow of a film made of P based material, such as an AlGaIn P, with a good surface morphology although such P based material has difficulty in obtaining good surface morphology. Thus, the configuration described above facilitates manufacturing a layered product with good crystal quality.

Further, growing an active layer on such an inclined substrate allows for an active layer with optical gain anisotropy, adjusting polarization property. In addition, output power per unit area increases as compared to the use of a non-inclined substrate.

In the above-described present embodiment, cases in which the normal-line direction of the surface of the substrate 101 is inclined toward the crystal orientation [1 1 1] A with respect to the crystal orientation [1 0 0]. However, no limitation is indicated thereby. The normal-line direction of the surface of the substrate 101 may be inclined toward any one of the crystal orientation [1 1 1], a crystal orientation [1 -1 -1], a crystal orientation [1 1 -1], and a crystal orientation [1 -1 1] relative to the crystal orientation [1 0 0].

In the embodiments described above, cases in which the inclined angle of the substrate 101 is 15 degrees are described. However, no limitation is indicated thereby.

In the embodiments described above, cases in which each of the light-emitting units LE has an oscillation wavelength of 808 nm are described. However, no limitation is indicated thereby. The oscillation wavelength of the light-emitting unit LE, such as a wavelength band of laser medium to absorb, may change according to the application.

The thickness of the selectively-oxidized layer 108 may change according to a design.

In the above-described embodiments, the cases in which the material containing AuSn alloy is used to join the heat-dissipative member 231 and the surface-emitting laser array chip 230 together are described. However, no limitation is intended thereby.

(20) The heat-dissipative member 231 and the surface-emitting laser array chip 230 may be joined together with solder paste.

(20) The heat-dissipative member 231 and the surface-emitting laser array chip 230 may be joined together with sintered material containing silver (Ag). In such s case, a heat stress due to the difference in coefficient of thermal expansion between the heat-dissipative member 231 and the surface-emitting laser array chip 230 is reduced.

Figure 25:
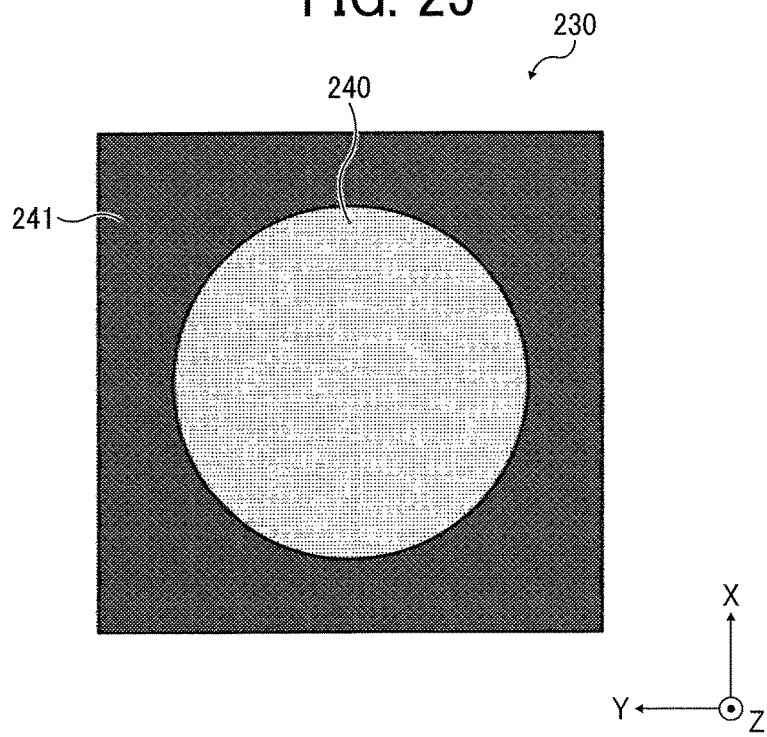
FIG. 25 illustrates a modification of a surface-emitting laser array according to an embodiment of the present disclosure.

In the embodiments described above, cases in which the light-emitting units LE are square-shaped are described. However, no limitation is indicated thereby. For example, as illustrated in FIG. 25, an area in which a plurality of light-emitting units LE is formed may be circular. As many condenser lenses are generally circular, the surface-emitting laser array 201 in which a plurality of surface-emitting lasers as light-emitting units LE are disposed in a circular manner is used to prevent wasting output power and allow an efficient collection of collection.

In the embodiments described above, cases in which the external shape of the cross section of the mesa is substantially square are described. However, no limitation is indicated thereby. Alternatively, in some embodiments, the external shape of the cross section of the mesa may be any shape, such as circular, elliptic, or rectangular.

Figure 26:
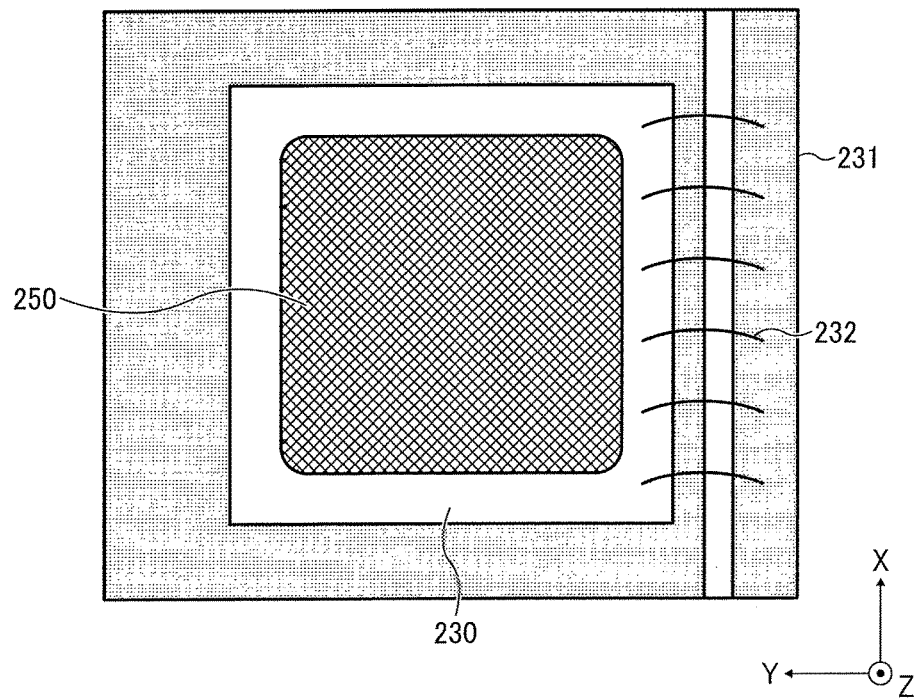
FIG. 26 is an illustration of an additionally disposed microlens array according to an embodiment of the present disclosure.
Figure 27:
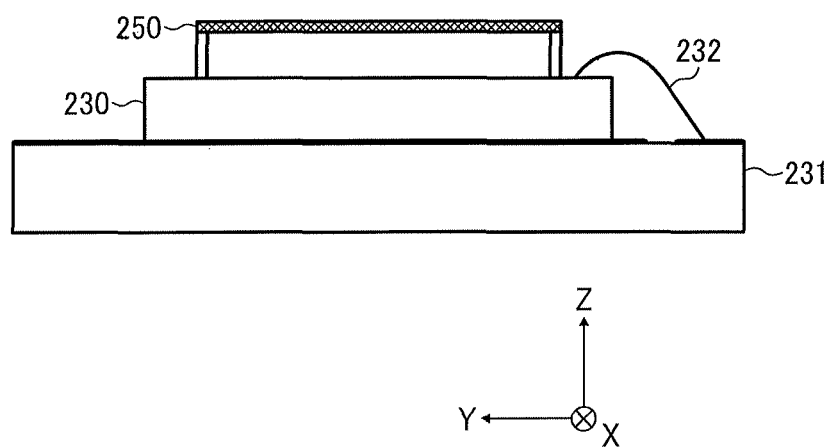
FIG. 27 is an illustration of addition of an additionally disposed microlens array according to another embodiment of the present disclosure.

In the above-described embodiments, as illustrated in FIGS. 26 and 27 for example, a microlens array 250 may be disposed at a position that optically corresponds to the surface-emitting laser array chip 230 on the +Z side. In such a case, the microlens array 250 renders the light emitted from the plurality of surface-emitting lasers aggregated with high density, parallel. Note that the microlens array 250 may be disposed with ultraviolet (UV)-curable resin.

Figure 28:
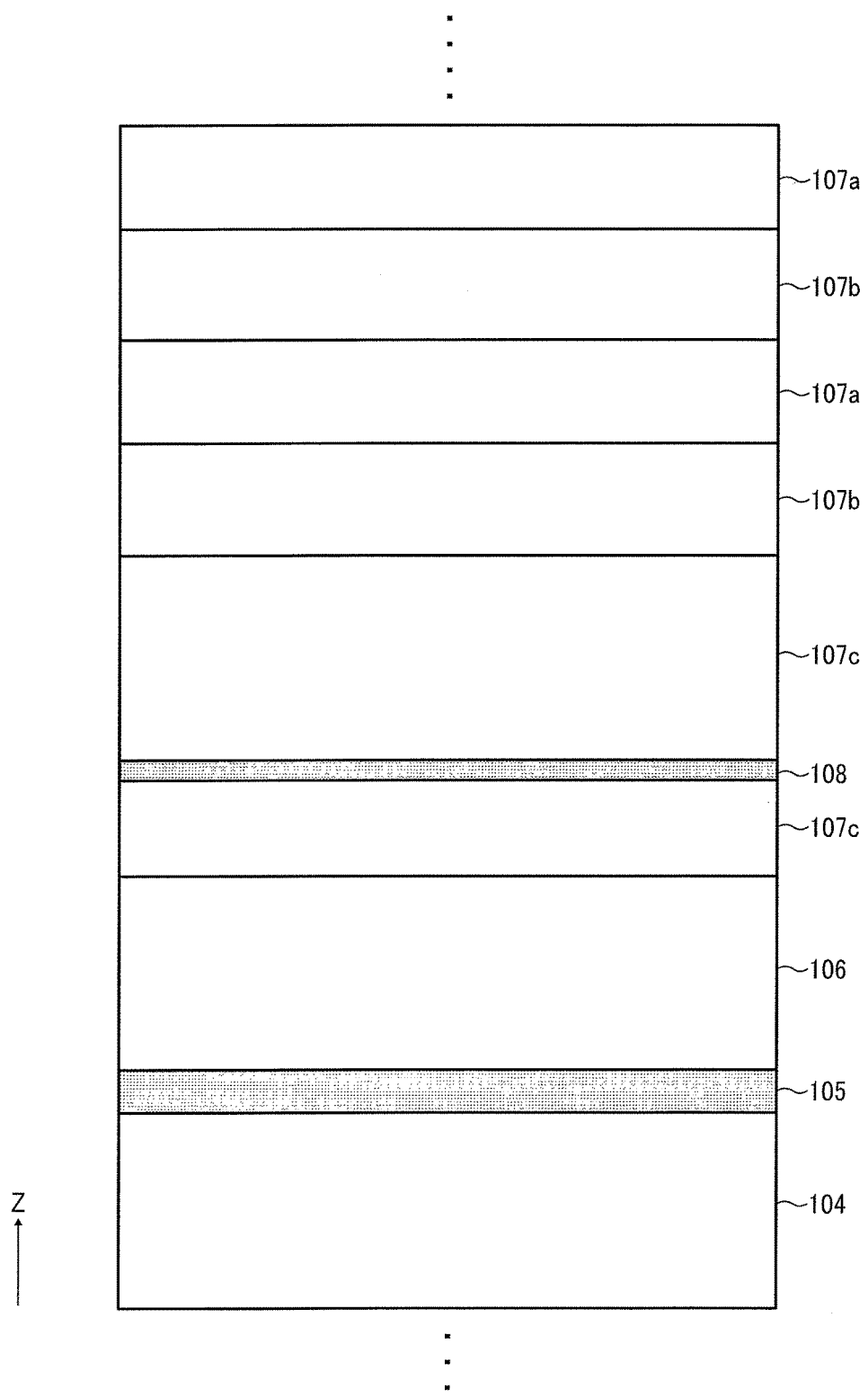
FIG. 28 is an illustration of a surface-emitting laser array according to a variation of an embodiment of the present disclosure.
Figure 29:
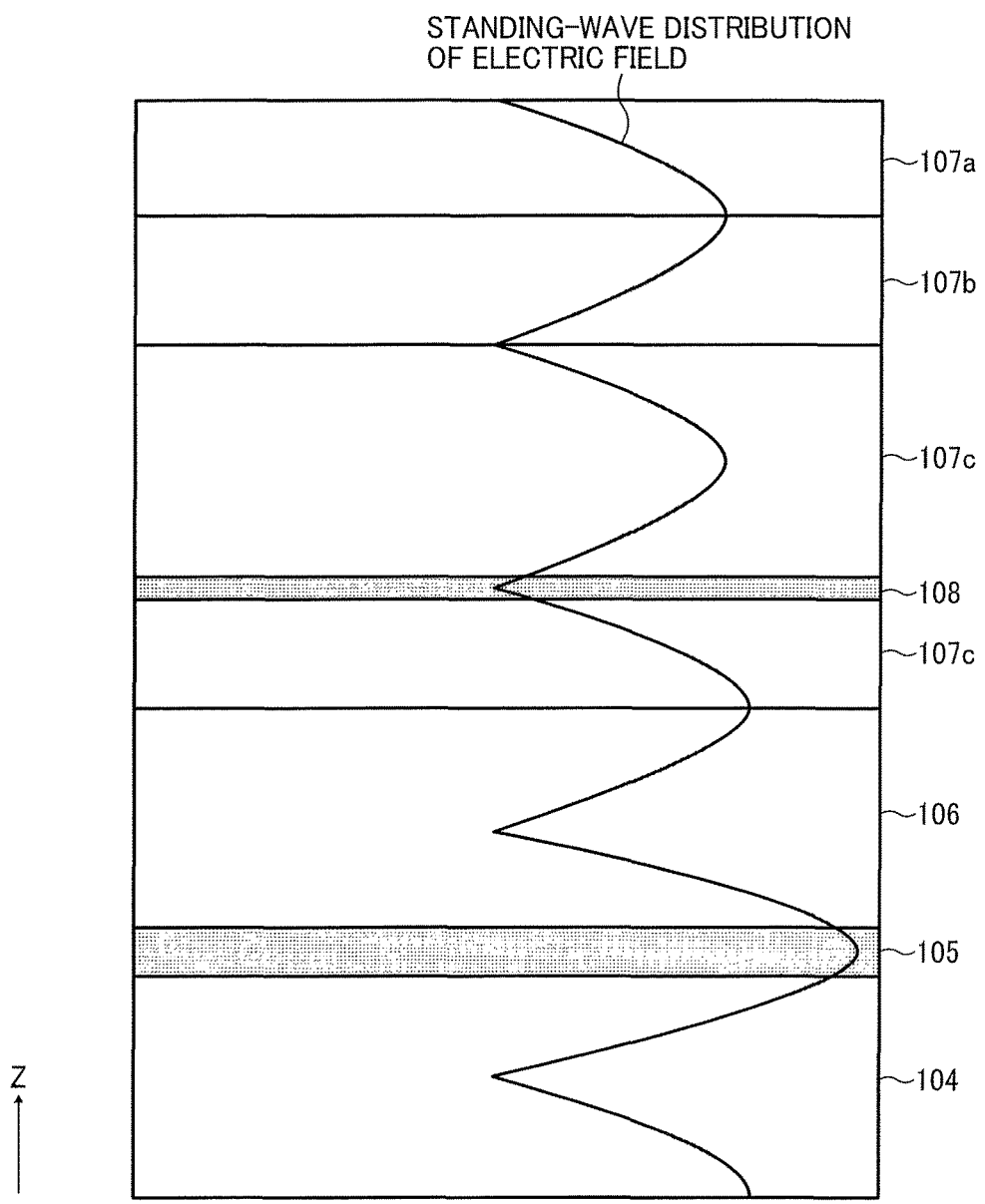
FIG. 29 is an illustration of standing-wave distribution of an electric field of a surface-emitting laser array according to a variation of an embodiment of the present disclosure.
Figure 30:
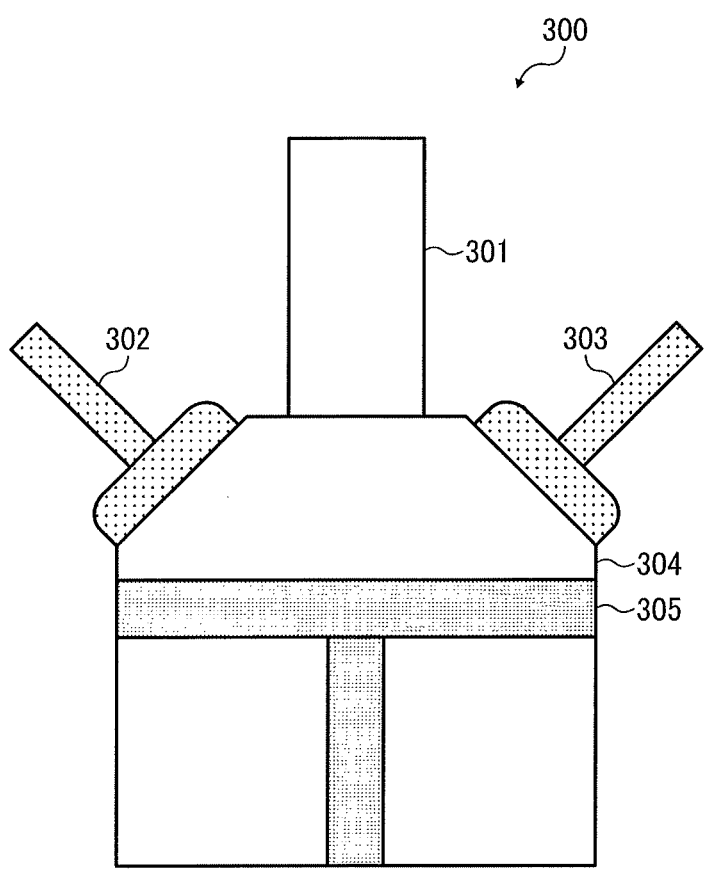
FIG. 30 is a schematic illustration of an engine according to an embodiment of the present disclosure.
Figure 31:
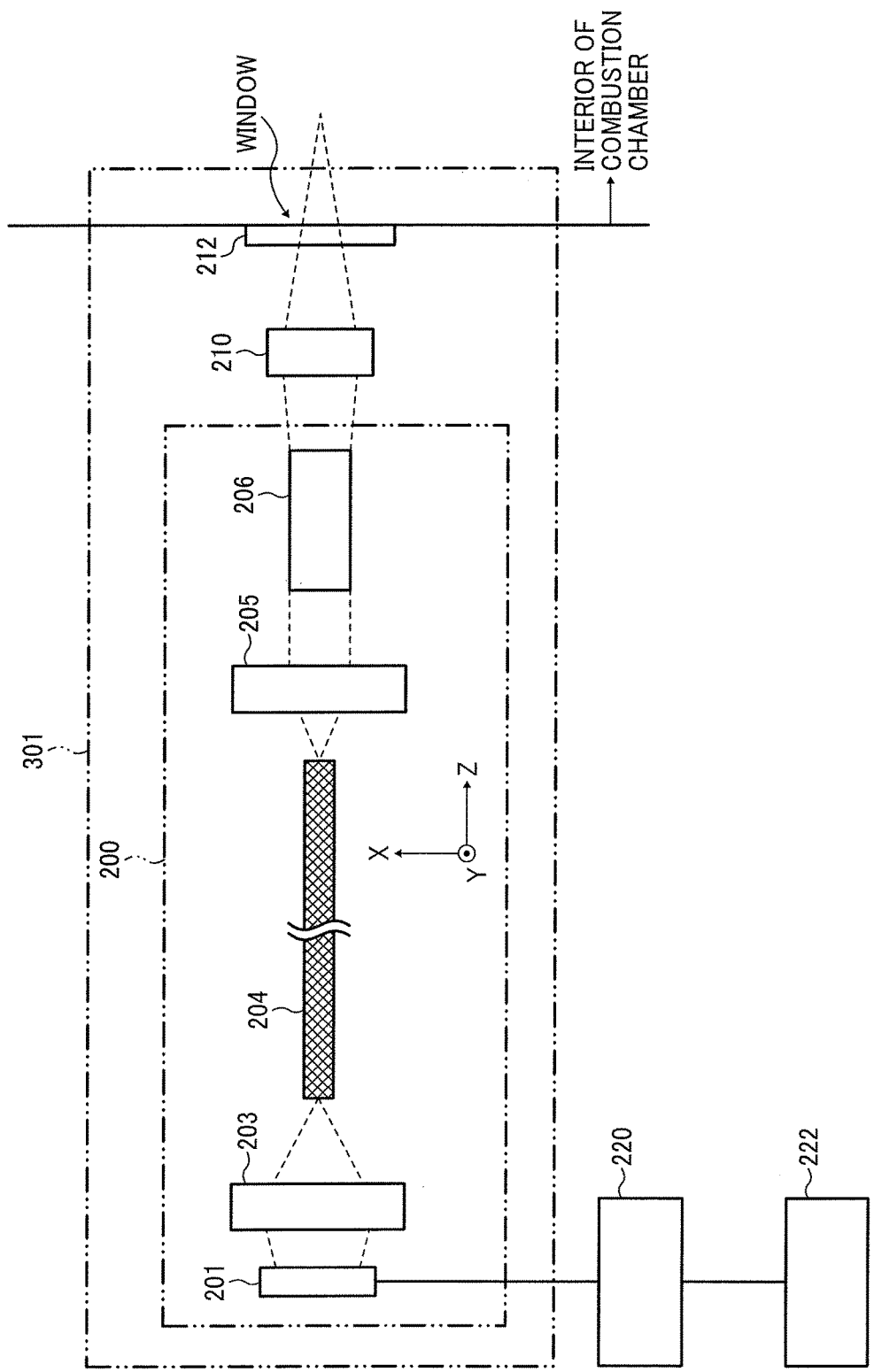
FIG. 31 is an illustration of an ignitor according to an embodiment of the present disclosure.

In the above-described embodiment, the optical thickness is $3\lambda/4$ of layers: the AlGaInP layer 107c, the selectively-oxidized layer 108, the anti-oxidation layer 115, and the second low refractive index layer 107a of the upper semiconductor DBR 107. The anti-oxidation layer 115 and the second low refractive index layer 107a are disposed on the oxidized layer 108 on the +Z side. In some embodiments, the anti-oxidation layer 115 and the second low refractive index layer 107a of the upper semiconductor layer DBR may be replaced by the AlGaInP layer (the first low refractive index layer 107c) as illustrated in FIGS. 28 and 29. That is, the AlGaInP layer 107c may be disposed on each side of the selectively-oxidized layer 108. In such a case, the optical thickness of the selectively-oxidized layer 108 and the AlGaInP layer 107c disposed on each side of the selectively-oxidized layer 108 (that is, two AlGaInP layers) is $(2n+1)\lambda/4$ (n is a natural number) when an oscillation wavelength at the active layer 105 is $\lambda$.

With the AlGaInP layers disposed on both sides of the selectively-oxidized layer 108, the valence band discontinuity in the selectively-oxidized layer 108 and the AlGaInP layers decreases, thereby preventing or reducing the heat generation as compared to the comparative example. As a result, the output power and reliability of the surface-emitting laser increases.

Specifically, the selectively-oxidized layer 108 is disposed at a note of the standing-wave distribution of the electric field, the position of which is distant from the upper spacer layer 106 by an optical distance of $\lambda/4$. The AlGaInP layer (the first low refractive index layer 107c) is disposed within an optical distance of $n\lambda/2$ from the center of the selectively-oxidized layer 108. In this case, at an optical distance of $n\lambda/2$, another node of the standing-wave distribution of the electric field is positioned.

In such a case, a gradient-composition layer may be disposed at the interface between the first low refractive index layer 107c and the high refractive index layer 107b, as in the interface in the typical upper semiconductor DBR, thereby reducing the resistance at heterointerface.

When the optical thickness between the selectively-oxidized layer 108 and the AlGaInP layer is assumed to be $\lambda/4$, a high refractive index layer is preferably disposed on the selectively-oxidized layer 108, which increases the valence band discontinuity and resistance. This is prevented by setting the optical thickness between the selectively-oxidized layer 108 and the AlGaInP layer to be $(2n+1)\lambda/4$.

In such a case, the heat generation is prevented that occurs on the +Z side layer of the selectively-oxidized layer 108 rather than on the selectively-oxidized layer 108.

Note that in the interface between the AlGaInP layer (the first low refractive index layer 107c) and the high refractive index layer 107b of the upper semiconductor DBR, a gradient-composition layer where the composition gradually changes from a side of the composition to the other side of the composition is provided to reduce the electrical resistance.

In the embodiments described above, cases in which AlN is used as the heat-dissipative member 231 material are described. However, no limitation is intended thereby. The material of the heat-dissipative member 231 preferably has a thermal conductivity higher than that of the semiconductor material that constitutes the surface-emitting laser array chip 230.

(Internal Combustion Engine)

FIG. 1 is a schematic diagram illustrating the principal parts of an engine 300 that serves as an internal combustion engine, according to an embodiment of the present invention.

The engine 300 includes, for example, an ignitor 301, a fuel injector 302, an exhauster 303, a combustion chamber 304, and a piston 305.

The operation of the engine 300 is briefly described. (1) The fuel injector 302 injects the inflammable fuel-air mixture into the combustion chamber 304 (aspiration). (2) The piston 305 moves upward and compresses the inflammable fuel-air mixture (compression). (3) The ignitor 301 emits laser beams into the combustion chamber 304. Accordingly, the fuel is ignited (ignition). (4) Inflammable gas is generated and the piston 305 moves downward (combustion). (5) The exhauster 303 exhausts the inflammable gas from the combustion chamber 304 (exhaust).

As described above, a series of processes including aspiration, compression, ignition, combustion, and exhaust are repeated. Then, the piston 305 moves upward and downward according to the changes in the volume of the gas in the combustion chamber 304, and kinetic energy is produced. As fuel, for example, natural gas and gasoline are used.

Note that the above operation of the engine 300 is performed based on the instruction made through an engine controller 222 that is externally provided and is electrically connected to the engine 300.

As illustrated in FIG. 2 for example, the ignitor 301 includes a laser device 200, an emission optical system 210, and a protector 212.

The emission optical system 210 collects and condenses the light emitted from the laser device 200. Accordingly, a high energy density can be obtained at a focal point. In some embodiments, one lens may constitute the emission optical system 210, or a plurality of lenses may constitute the emission optical system 210.

The protector 212 is a transparent window facing toward the combustion chamber 304. In the present embodiment, for example, sapphire glass is used as a material of the protector 212.

The laser device 200 includes a surface-emitting laser array 201, a first condensing optical system 203, an optical fiber 204 as a light transmission member, a second condensing optical system 205, and a laser resonator 206.

In the present embodiment, the focal point of light emitted from the laser device 200 in the Z-axis direction can be controlled by adjusting the focal length of the emission optical system 210 and the position of the emission optical system 210 in the Z-axis direction.

The surface-emitting laser array 201 is a pump source, and includes a plurality of light-emitting units. Each of the light-emitting units. LM is a vertical cavity-surface-emitting laser (VCSEL) with an oscillation wavelength of 808 nm.

Thus, a surface-emitting laser array is a light source that is advantageous in pumping Q-switched laser whose characteristics vary widely due to the displacement in pumping wavelength. This is because very little wavelength displacement of emitted light occurs due to changes in temperature. Accordingly, when a surface-emitting laser array is used as a pump source, the temperature control of the environment becomes easier.

The first condensing optical system 203 collects and condenses the light emitted from the surface-emitting laser array 201. In some embodiments, one lens may constitute the first condensing optical system 203, or a plurality of lenses may constitute the first condensing optical system 203.

The optical fiber 204 is disposed such that the light exited from the first condensing optical system 203 is condensed at the center of the −Z side lateral edge face of the core.

Due to the provision of the optical fiber 204, the surface-emitting laser array 201 may be disposed at a position distant from the laser resonator 206. Accordingly, the degree of flexibility in design increases. As the surface-emitting laser array 201 can be disposed at a position away from the heat source when the laser device 200 is used for an ignitor, the ranges of choices for a method for cooling the engine 300 can be extended.

The light that has entered the optical fiber 204 propagates through the core, and is exited from the +Z side lateral edge face of the core.

The second condensing optical system 205 is disposed in the optical path of the light emitted from the optical fiber 204, and condenses the light emitted from the optical fiber 204. In some embodiments, one lens may constitute the second condensing optical system 205, or a plurality of lenses may constitute the first condensing optical system 203. The light that has been condensed by the second condensing optical system 205 enters the laser resonator 206.

The laser resonator 206 is a Q-switched laser, and as illustrated in FIG. 3 for example, the laser resonator 206 includes a laser medium 206a and a saturable absorber 206b.

In the present embodiment, Nd: YAG crystal and Cr: YAG crystal are bonded together to form a so-called composite crystal. Moreover, the Nd: YAG crystal and the Cr: YAG crystal are both ceramic.

The light that has been condensed by the second condensing optical system 205 enters the laser medium 206a. In other words, the laser medium 206a is optically pumped by the light that has been condensed by the second condensing optical system 205. It is desired that the wavelength of the light that is emitted from the surface-emitting laser array 201 be 808 nanometer (nm) where the absorption efficiency is the highest in the YAG crystal. The saturable absorber 206b performs Q-switching.

Figure 32:
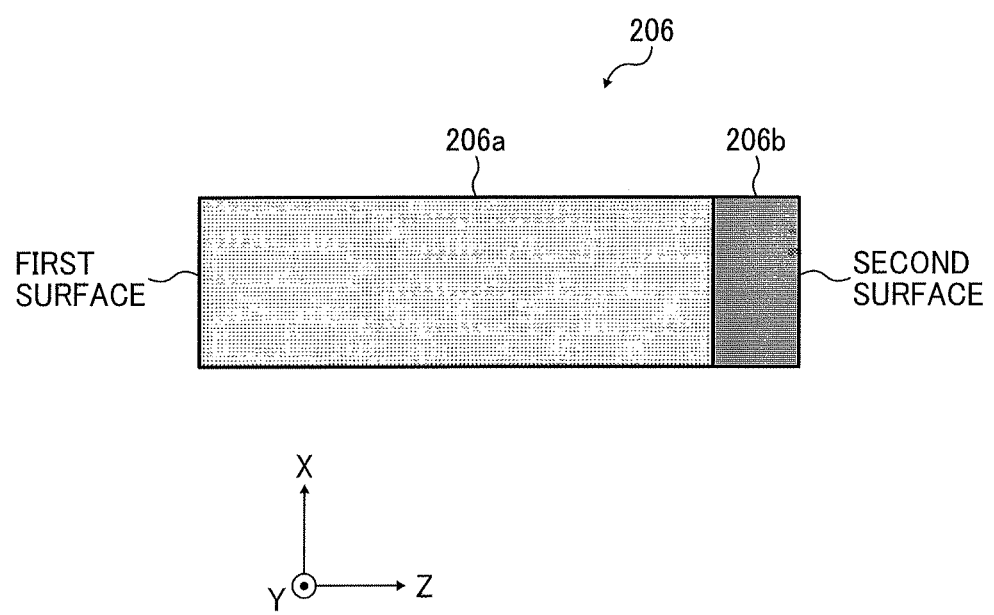
FIG. 32 is an illustration of a laser resonator according to an embodiment of the present disclosure.

The surface on the light entering side (−Z side) of the laser medium 206a and the surface on the light exiting side (+Z side) of the saturable absorber 206b are optically polished, and each of these surfaces serves as a mirror. In the following description, for the sake of explanatory convenience, the surface on the light entering side of the laser medium 206a is referred to as a first surface, and the surface on the light exiting side of the saturable absorber 206b is referred to a second surface (see FIG. 32).

On the first and second surfaces, a dielectric layer is coated according to the wavelength of the light that is emitted from the surface-emitting laser array 201 and the wavelength of the light that exits from the laser resonator 206.

More specifically, a dielectric layer that indicates sufficient high transmittance to light with the wavelength of 808 nm and indicates sufficiently high reflectance to light with the wavelength of 1064 nm is coated on the first surface. On the second surface, a dielectric layer with selected reflectance indicating a desired threshold to light with the wavelength of 1064 nm is coated.

Accordingly, the light is resonated and amplified inside the laser resonator 206. In the present embodiment, the length of the laser resonator 206 is 10 mm.

As illustrated in FIG. 2, the drive device 220 drives the surface-emitting laser array 201 based on an instruction from the engine controller 222. More specifically, the drive device 220 drives the surface-emitting laser array 201 such that the ignitor 301 emits light at the timing when the engine 300 performs ignition. Note that a plurality of light-emitting units of the surface-emitting laser array 201 are switched on and switched off at the same time.

As described above, the laser device 200 according to the present embodiment, which includes the surface-emitting laser array 201, effectively emits high-power laser beams.

In the surface-emitting laser array 201 according to the present embodiment, the mesa structures are aggregated with high density. Such a configuration still offers output power equal to that of the typical surface-emitting laser array even in a reduction in size of the surface-emitting laser array 201 according to the present embodiment. Accordingly, the surface-emitting laser array 201 according to the present embodiment provides a reduced spot diameter of light when a condenser lens collects and condenses the light.

Such a configuration allows a reduced core diameter of an optical fiber and emission of light with greater output power with high beam quality being maintained. Thus, the configuration according to the present embodiment allows a transmission and emission of light having high-output power with high beam quality being maintained.

The provision of the laser device 200 allows the ignitor 301 according to the present embodiment to perform ignition in a stable manner.

Due to the provision of the ignitor 301, the operation of the engine 300 according to the present embodiment is stabilized.

Note that, with the area in which a plurality of light-emitting units are formed being circular (refer to FIG. 25), excited light is effectively input to the optical fiber 204.

When the surface-emitting laser array 201 is not disposed at a position distant from the laser resonator 206 in the embodiments described above, the provision of the optical fiber 204 may be omitted.

In the embodiments described above, cases of an engine (piston engine) where a piston is moved by inflammable gas is used as an internal combustion engine are described. However, no limitation is intended thereby. For example, a rotary engine, a gas turbine engine, and a jet engine may be used as an internal combustion engine. In other words, any engine may be used as long as the engine burns fuel to produce inflammable gas.

The ignitor 301 may be used for cogeneration in which exhaust heat is reused to increase the comprehensive energy efficiency. The exhaust heat in cogeneration is used for obtaining motive power, heating energy, or cooling energy.

In the embodiments described above, cases in which the ignitor 301 is used for an internal combustion engine are described. However, no limitation is intended thereby.

In the embodiments described above, cases in which the laser device 200 is used for an ignitor are described. However, no limitation is intended thereby. For example, the laser device 200 may be used for a laser beam machine, a laser peening apparatus, or a terahertz generator.

In the above-described embodiments, the cases in which a surface-emitting laser is used in the laser device 200 as a pump source are described. However, no limitation is intended thereby. In some embodiments, the surface-emitting laser may be used in the laser device 200 not as a pump source.

(Laser Annealing Device)

Figure 33A:
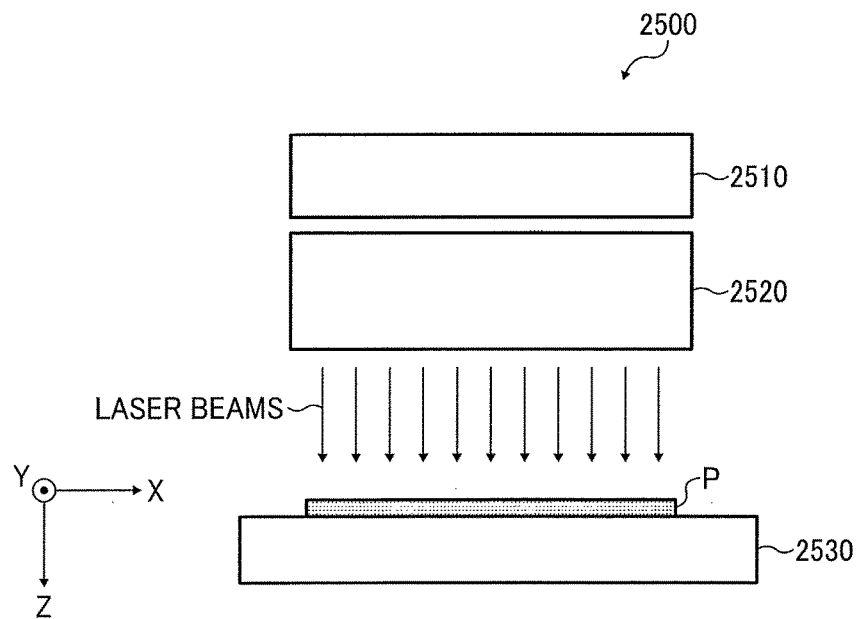
FIGS. 33A and 33B each is an illustration of a laser annealing device according to an embodiment of the present disclosure.
Figure 33B:
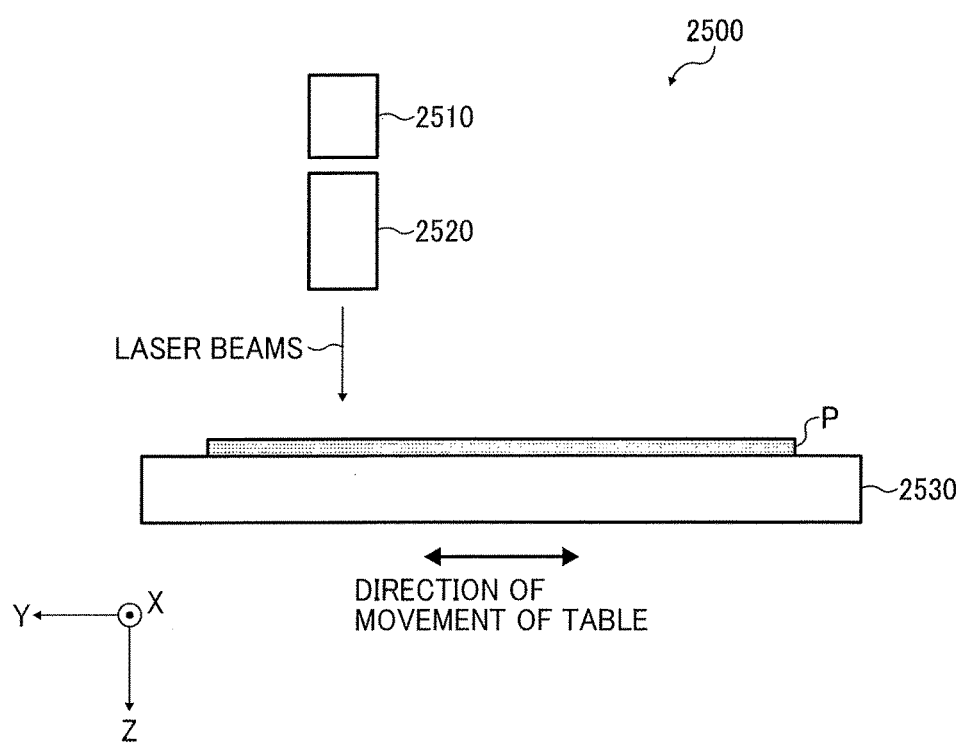

FIGS. 33A and 33B each is a schematic view of a configuration of a laser annealing device 2500 illustrated as a laser device. The laser annealing device 2500 includes an annealing light source 2510 for the laser annealing device 2500, an annealing optical system 2520 for the laser annealing device 2500, a table device 2530, and a control circuit for annealing.

The annealing light source 2510 includes the above-described surface-emitting laser array 201. The annealing optical system 2520 guides light emitted from the annealing light source 2510 toward the surface of the target P. The table device 2030 includes a table on which a target P is placed. The table moves along at least the Y-axis direction.

For example, when the annealing light source 2510 emits light to the target P that is amorphous silicon (a-Si), the amorphous silicon (a-Si) is heated and gradually cooled to be crystallized into polysilicon (p-Si).

In such cases, the laser annealing device 2500 with the light source having the surface-emitting laser array 201 increases the process efficiency of annealing.

(Laser Beam Machine)

Figure 34:
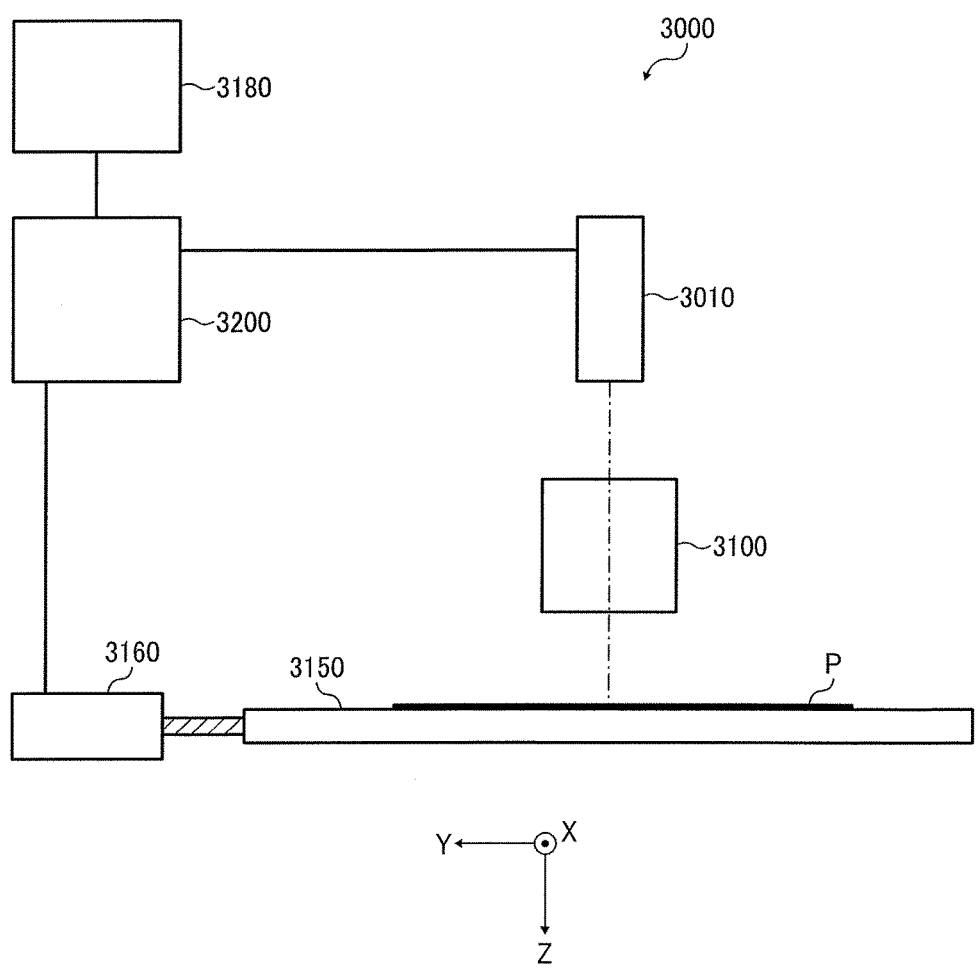
FIG. 34 is an illustration of a laser beam machine according to an embodiment of the present disclosure.

FIG. 34 is a schematic view of a configuration of a laser beam machine 3000 illustrated as a laser device. The laser beam machine 3000 includes a laser-beam light source 3010 for the laser beam machine 3000, an optical system 3100, a table 3150 on which a target P is placed, a table drive device 3160, an operation panel 3180, and a control circuit 3200.

The laser-beam light source 3010 that includes the surface-emitting laser array 201 emits light based on an instructions from the control circuit 3200. The laser-beam optical system 3100 collects and condenses the light emitted from the laser-beam light source 3010, around the surface of the target P. The table drive device 3160 moves the table 3150 in the X-axis direction, the Y-axis direction, and the Z-axis direction, based on the instructions from the control circuit 3200.

The operation panel 3180 has a plurality of keys used by an operator to perform several kinds of settings or processes, and a display that displays several kinds of information. The control circuit 3200 controls the laser-beam light source 3010 and the table drive device 3160 based on the several kinds of information from the operation panel 3180.

In such cases, the laser beam machine 3000 with the laser-beam light source 3010 having the surface-emitting laser array 201 increases the efficiency of machining processes (for example, cutting and welding).

Note that the laser beam machine 3000 may include a plurality of light sources 3010.

The surface-emitting laser array 201 is also suitable for use in any devices that employ laser beams, other than laser annealing devices and laser beam machines. For example, the end-surface-emitting laser array 201 may be used as a light source for a display.

(Image Forming Apparatus)

Figure 35:
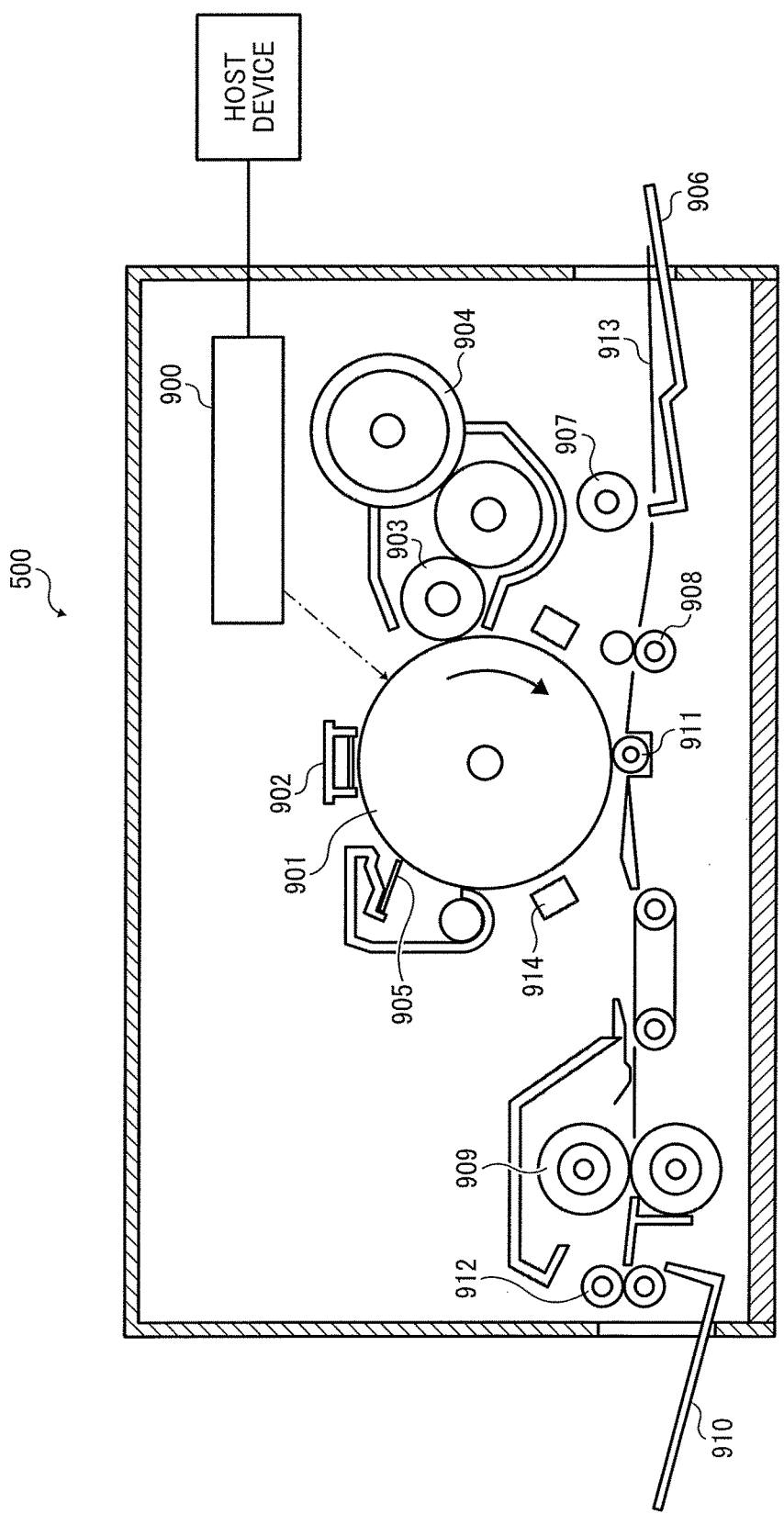
FIG. 35 is an illustration of a laser printer according to an embodiment of the present disclosure.

FIG. 35 is a schematic view of a configuration of a laser printer 5000 illustrated as an image forming apparatus.

The laser printer 500 includes an optical scanner 900, a photoconductor drum 901, a charger 902, a developing roller 903, a toner cartridge 904, a cleaning blade 905, a paper feed tray 906, a paper feed roller 907, a registration roller 908, a transfer charger 911, a discharger 914, a fixing roller 909, an ejection roller 912, and a paper output tray 910.

A photosensitive layer is formed on the surface of the photoconductor drum 901. The photoconductor drum 901 rotates in the direction of the arrow as illustrated in FIG. 35.

Around the surface of the photoconductor drum 901 are disposed the charger 902, the developing roller 903, the transfer charger 911, the discharger 914, and cleaning blade 905. In this case, the charger 902, the developing roller 903, the transfer charger 911, the discharger 914, and the cleaning blade 905 are disposed in this recited order along the direction of rotation of the photoconductor drum 901.

The charger 902 evenly charges the surface of the photoconductor drum 901.

The optical scanner 900 scans the surface of the photoconductor drum 901 electrically charged by the charger 902 with light modulated based on image data received from a host device, e.g., a personal computer (PC). Accordingly, a latent image that corresponds to the image data is formed on the surface of the photoconductor drum 901. That is, the surface of the photoconductor drum 901 is scanned by the optical scanner 900. Here, the photoconductor drum 901 is an image bearer that carries an image. The latent image formed as above moves toward the developing roller 903 with rotation of the photoconductor drum 901. A description is given later of the configuration of the optical scanner 900.

The toner cartridge 904 stores toner that is to be supplied to the developing roller 903.

The developing roller 903 renders a latent image manifest by making the toner supplied from the toner cartridge 904 adhere to the latent image formed on the surface of the photoconductor drum 901. The toner images moves toward the transfer charger 911 with rotation of the photoconductor drum 901.

The paper feed tray 906 stores recording paper 913 therein. The paper feed roller 907 is disposed near the paper feed tray 906, and the paper feed roller 907 takes a piece of recording paper 913 from the paper feed tray 906 one by one and conveys the taken recording sheet to the registration roller 908. The registration roller 908 is disposed near the transfer charger 911. The registration roller 908 temporarily holds the recording paper 913 taken by the paper feed roller 907 and sends the recording paper 913 to a space between the photoconductor drum 901 and the transfer charger 911 with rotation of the photoconductor drum 901.

The transfer charger 911 has a voltage having an polarity opposite to the polarity of toner to electrically attract toner from the surface of the photoconductor drum 901 onto the recording paper 913. Accordingly, the toner image is transferred from the surface of the photoconductor drum 901 onto the recording paper 913. The recording paper 913 onto which the toner image has been transferred is conveyed to the fixing roller 909.

At the fixing roller 909, heat and pressure are applied to the recording paper 913 to fix the toner on the recording paper 913. The recording paper 913 on which the toner is fixed is conveyed to the paper output tray 910 through the ejection roller 912 so that the recording paper 913 is stacked on the paper output tray 910 one after another.

The discharger 914 removes electricity from the surface of the photoconductor drum 901.

The cleaning blade 905 removes the residual toner on the surface of the photoconductor drum 901. Note that the removed residual toner is to be reused. The surface of the photoconductor drum 901 from which the residual toner has been removed moves back again to a position where the surface of the photoconductor drum 901 faces the charger 902.

(Optical Scanner)

Next, a description is given of a configuration of the optical scanner 900.

Figure 36:
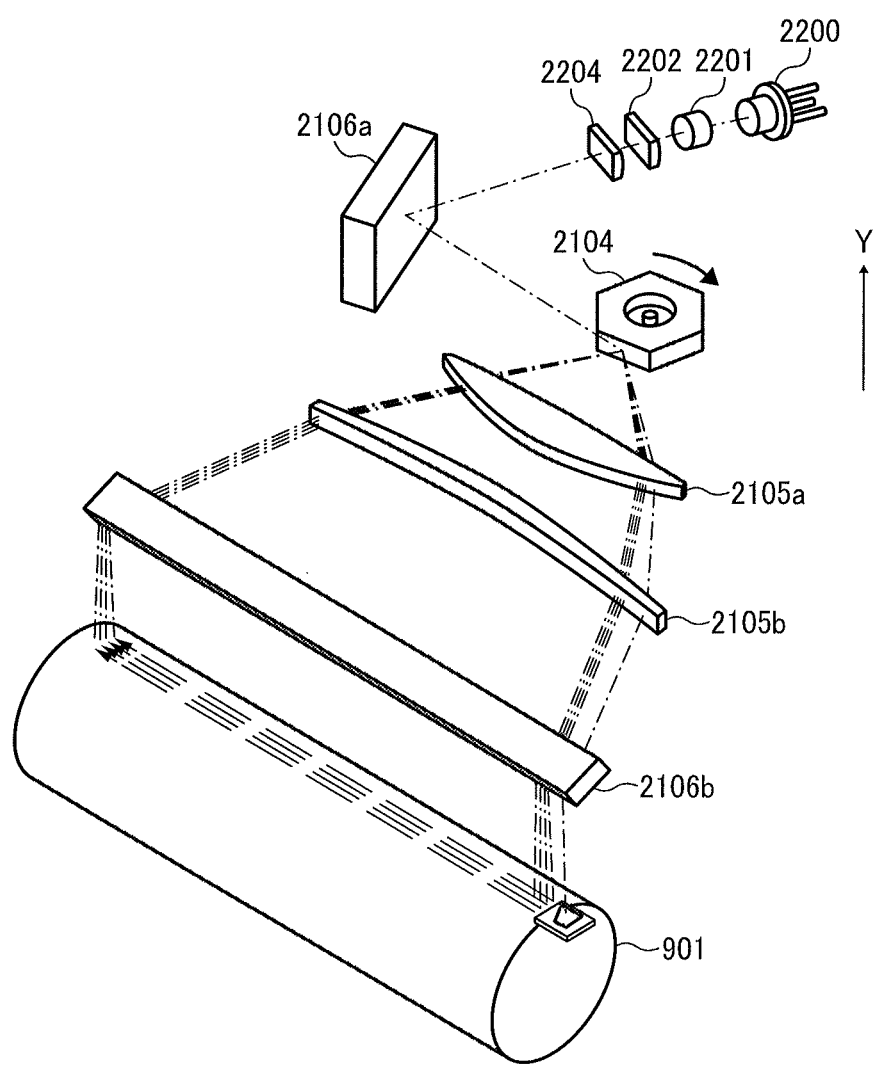
FIG. 36 is an illustration of an optical scanner according to an embodiment of the present disclosure.

As illustrated in FIG. 36 for example, the optical scanner 900 includes a scanning light source 2200 for the optical scanner 900, an aperture plate 2202, a cylindrical lens 2204, a polygon mirror 2104 as a light deflector, a first scan lens 2105a, a second scan lens 2105b, a reflection mirror 2106a, a mirror 2106b, and a scan-control circuit.

Hereinafter, a direction corresponding to a main scanning direction is referred to simply as a "main-scanning direction", and a direction corresponding to a sub-scanning direction is referred to simply as a "sub-scanning direction" in each optical component.

The coupling lens 2201 is disposed on the optical path of the light emitted from the scanning light source 2200, and collimates the light.

The aperture plate 2202 includes an aperture to shape light having passed through the coupling lens 2201.

The cylindrical lens 2204 forms an image of the light having passed through the aperture of the aperture plate 2202, at a position near the deflection-reflection plane of the polygon mirror 2104 in the Y-axis direction, using the reflection mirror 2106a.

The polygon mirror 2104 has a plurality of specular surfaces (six specular surfaces in the present embodiment) that rotate around the rotation axis parallel to the Y-axis direction. Each specular surface is the deflection-reflection plane. The polygon mirror 2104 deflects the light coming from the cylindrical lens 2204.

The light deflected by the polygon mirror 2104 passes through the first scan lens 2105a, the second scan lens 2105b, and the mirror 2106b, arriving at the photoconductor drum 901 so that the photoconductor drum 901 is exposed to the light and a light-beam spot is formed on the photoconductor drum 901. The formed light-beam spot moves along the longitudinal direction of the photoconductor drum 901 with rotation of the polygon mirror 2104. In some embodiments, one lens may constitute a scanning optical system 2105, or a plurality of lenses may constitute the scanning optical system 2105.

The scanning light source 2200 includes a surface-emitting laser array 201A that has the same configuration and is manufactured in the same manner as the surface-emitting laser array 201 does. Note that the degree of deflection of light at each light-emitting unit is adjusted by distorting an active layer to prevent or reduce the occurrence of unevenness of image density for use in electrophotography. For this reason, the active layer is preferably GaInPAs/GaInP instead of $GaAs/Al_{0.3}Ga_{0.7}As$.

Figure 37:
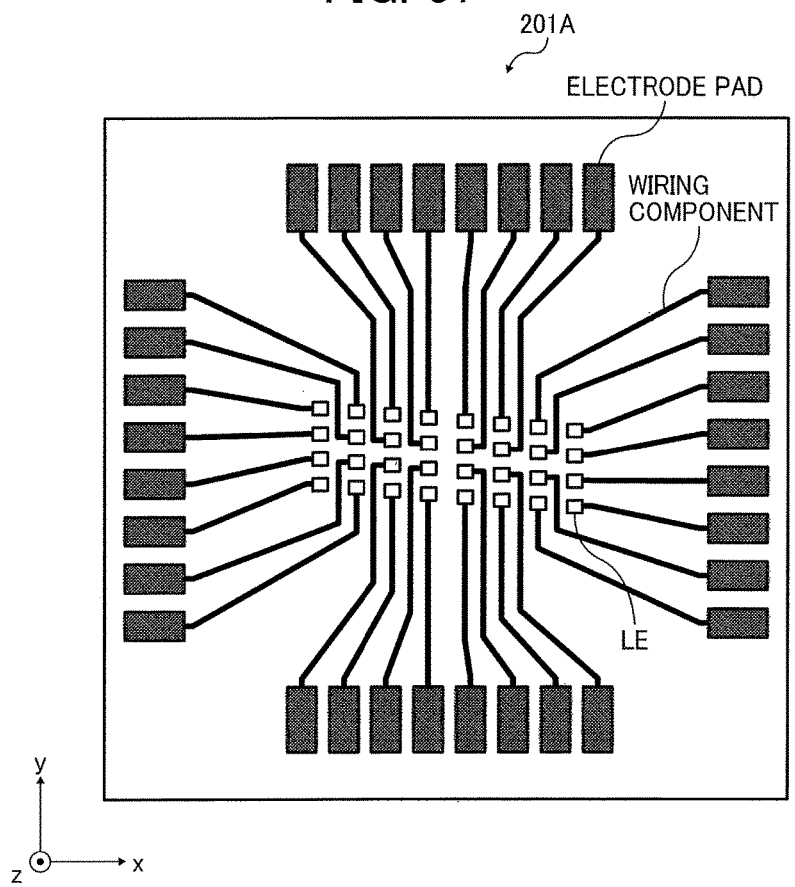
FIG. 37 is an illustration of a surface-emitting laser array according to an embodiment of the present disclosure.

As illustrated in FIG. 37 for example, the surface-emitting laser array 201A includes thirty-two light-emitting units that are two-dimensionally arranged.

Figure 38:
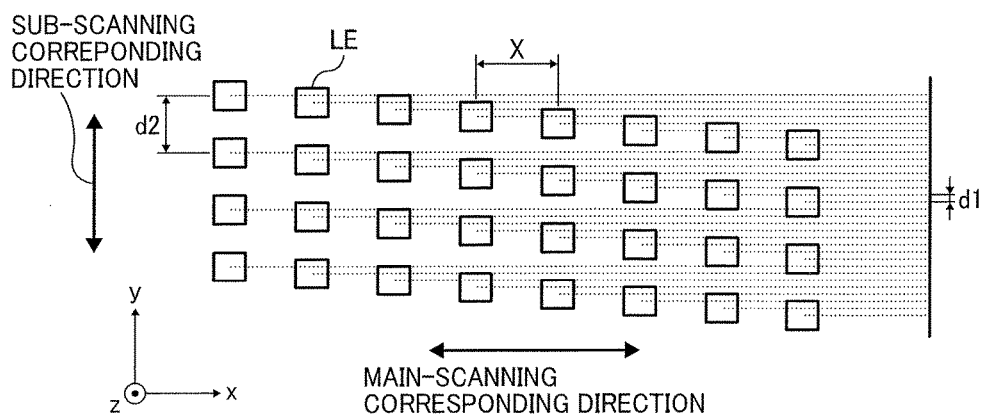
FIG. 38 is an illustration of the arrangement of a plurality of light-emitting units in the surface-emitting laser array according to an embodiment of the present disclosure.

When all of the thirty-two light-emitting units are orthogonally projected along a virtual line that extends in the sub-scanning direction as illustrated in FIG. 38, the light-emitting units are disposed at even intervals d1. In this case, the "interval between the light-emitting units" refers to the distance between the centers of two light-emitting units.

Note that adjusting the timing of switching on each light-emitting unit achieves the configuration in which the light-emitting units are arranged at even intervals in the sub-scanning direction on the photoconductor drum 901. Such a configuration allows a plurality of scanning lines to be scanned with the light in one scan.

When the interval d1 is 2.65 μm and the magnification of the optical system of the optical scanner 900 is 2, high-density writing is successfully performed with a density of 4800 dots per inch (dpi). As a matter of course, when another array configuration with a reduced interval d1 is formed by increasing the number of light-emitting units in the main-scanning direction or narrowing a pitch d2 (refer to FIG. 38) or when the magnification of the optical system is reduced, higher-density writing and high-quality printing are achieved. Note that adjusting the timing of switching on (emitting light of) each emitting-light unit easily changes the interval of writing in the main scanning direction.

In such a case, the laser printer 500 performs printing without slowing down the print speed even with an increase in writing dot density. This is because each light-emitting unit emits light in a single lateral mode, at high output power. With no changes in writing dot density, the print speed of the laser printer 500 further increases.

The optical scanner 900, which includes the scanning light source 2200 with the surface-emitting laser array 201A, forms higher-definition latent images on the surface of the photoconductor drum 901 at high speed.

A multicolor image forming apparatus that includes an optical scanner adapted for color images also foul's higher-definition images at high speed.

As an example of the multicolor image forming apparatus, a tandem color printer including a plurality of photoconductor drums, such as photoconductor drums for black, cyan, magenta, and yellow, may be used.

The surface-emitting laser array 201 according to the embodiments of the present disclosure is suitable for a light transmission module that generates light signal according to an input electrical signal. For example, a light transmission module is available that includes the surface-emitting laser array 201 and a drive device 220 which drives the surface-emitting laser array 201 according to an input electrical signal. Further, a light transmission system is available that includes the described-above light transmission module, a light transmission medium, and a converter. The light transmission medium transmits a light signal generated by the light transmission module. The converter converts the light signal sent from the light transmission medium into an electrical signal.

(Light Transmission System)

Figure 39:
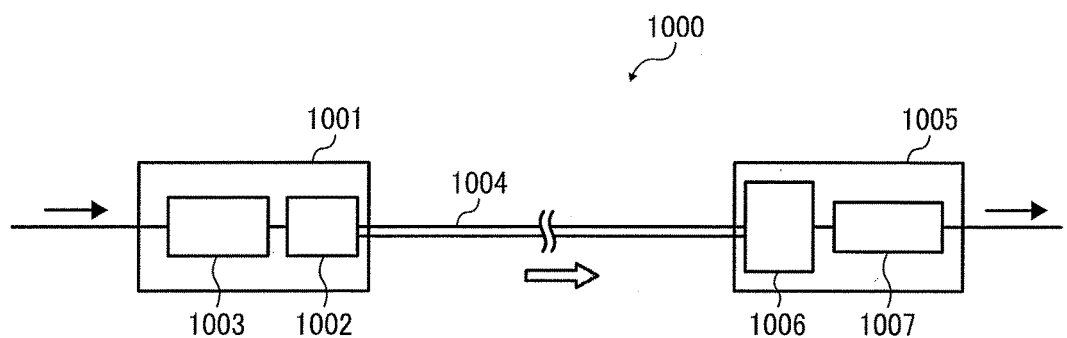
FIG. 39 is an illustration of a light transmission system according to an embodiment of the present disclosure.

FIG. 39 is a schematic view of a light transmission system 1000 according to an embodiment of the present disclosure. The light transmission system 1000 includes an optical transmitter module 1001 as the light transmission module and an optical receiver module 1005 which are connected to each other via an optical fiber cable 1004 as a light transmission medium, that allows one-directional optical communication from the optical transmitter module 1001 to the optical receiver module 1005.

The optical transmitter module 1001 includes a drive circuit 1003 and the light source 1002 with the surface-emitting laser array 201. The drive circuit 1003 modulates light intensity of a laser beam output from the light source 1002, according to an externally input electrical signal.

The light signal output from the light source 1002 is sent to the optical receiver module 1005 that is coupled to the optical fiber cable 1004.

The optical receiver module 1005 includes a light-receiving element 1006 as a converter and a receiving circuit 1007. The light-receiving element 1006 converts the light signal into an electrical signal. The receiving circuit 1007 amplifies the electrical signal output from the light-receiving element 1006, and shapes the waveform of the electrical signal.

The optical transmitter module 1001, which includes the surface-emitting laser array 201 in the light source 1002, efficiently sends signals at high output power.

The light transmission system 1000, which includes the optical transmitter module 1001, allows an efficient and high-precision communication.

In the above-described embodiment, the example configuration of one-directional communication with a single channel is described. However, the present disclosure is not limited to such a configuration. In some embodiments, a configuration of a bidirectional communication, a parallel transmission system, or a wavelength division multiplex transmission system may be available. In other words, the light source 1002 preferably includes the surface-emitting laser array 201.

Figure 40:
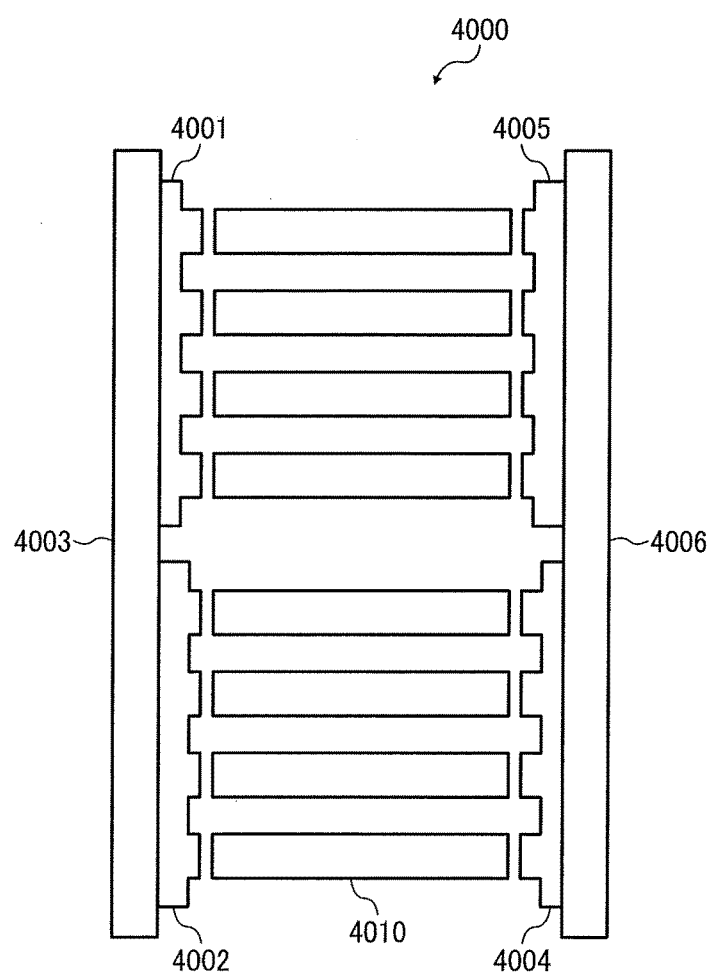
FIG. 40 is an illustration of an optical communication system.

FIG. 40 is an illustration of an optical communication system 4000 that transmits and receives a light signal. The optical communication system 4000 includes a first board 4003 and a second board 4006, and an optical fiber 4010 disposed between the boards 4003 and 4006. Each of the boards 4003 and 4006 is an optical transmitter and receiver module.

On the first board 4003 are mounted a surface-emitting laser array 4001, a drive circuit to drive the surface-emitting laser array 4001, a light-receiving element 4002, and a processing circuit to process a signal output from the light-receiving element 4002.

On the second board 4006 are mounted a surface-emitting laser array 4004, a drive circuit to drive the surface-emitting laser array 4004, a light-receiving element 4005, and a processing circuit to process a signal output from the light-receiving element 4005.

The light that is emitted from the surface-emitting laser array 4001 is received by the light-receiving element 4005 through the optical fiber 4010. The light that is emitted from the surface-emitting laser array 4004 is received by the light-receiving element 4002 through the optical fiber 4010.

Each of the boards 4003 and 4006 are connected to a personal computer to perform data processing. Each surface-emitting laser array includes a surface-emitting laser array that has the same configuration and is manufactured in the same manner as the surface-emitting laser array 201 does. With such a configuration, higher performance of the optical transmitter and receiver module is achieved, thus achieving higher performance and more reliability of the optical communication system.

What is claimed is:

1. A surface-emitting laser comprising:
an active layer;
a spacer layer disposed on the active layer; and
a reflection mirror disposed on the spacer layer, the reflection mirror including a current constriction layer that is a selectively-oxidized layer made of Al(Ga)As,
the current constriction layer disposed at a position of a node of a standing-wave of an electric field of light oscillated at the active layer and disposed away from an interface between the spacer layer and the reflection mirror by an optical distance of one-fourth of an oscillation wavelength at the active layer,
the reflection mirror including at least one AlGaInP layer that is in direct contact with the selectively-oxidized layer made of Al(Ga)As.

2. The surface-emitting laser according to claim 1,
wherein the at least one AlGaInP layer includes two AlGaInP layers,
wherein the selectively-oxidized layer is disposed between the two AlGaInP layers, and
wherein an optical thickness of the selectively-oxidized layer and the two AlGaInP layers is $(2n+1)\lambda/4$, where n is a natural number and $\lambda$ is the oscillation wavelength at the active layer.

3. The surface-emitting laser according to claim 1,
wherein the at least one AlGaInP layer is disposed on only one side of the selectively-oxidized layer that faces the active layer.

4. The surface-emitting laser according to claim 1,
wherein the selectively-oxidized layer is made of $Al_{x1}Ga_{1-x1}As$,
wherein Al content x1 satisfies a relation of $0.95 \leq x1 \leq 1$,
wherein the at least one AlGaInP layer is made of $(Al_{x2}Ga_{1-x2}As)_{0.5}In_{0.5}P$, and
wherein Al content x2 satisfies a relation of $0.04 \leq x2 \leq 2.80x1 - 1.92$.

5. The surface-emitting laser according to claim 1,
wherein the spacer layer is made of $(Al_{x3}Ga_{1-x3})_{0.5}In_{0.5}P$,
wherein Al content x3 satisfies a relation of $0 \leq x3 \leq 0.55$, and
wherein a difference in band gap energy between the at least one AlGaInP layer and the spacer layer is greater than or equal to 102 meV.

6. The surface-emitting laser according to claim 1,
wherein a valence band discontinuity between the spacer layer and the AlGaInP layer is less than or equal to 134 meV.

7. The surface-emitting laser according to claim 1,
wherein a plurality of semiconductor layers is disposed between the active layer and a substrate, and
wherein the substrate is an inclined substrate that is inclined toward any one of a crystal orientation [1 1 1], a crystal orientation [1 −1 −1], a crystal orientation [1 1 −1], and a crystal orientation [1 −1 1] relative to a crystal orientation [1 0 0].

8. A surface-emitting laser array comprising a plurality of surface-emitting lasers, each being the surface-emitting laser according to claim 1.

9. A laser device comprising:
the surface-emitting laser array according to claim 8; and
an optical system to guide a laser beam emitted from the surface-emitting laser array to a target.

10. A laser device comprising:
the surface-emitting laser array according to claim 8; and
a condensing optical system to collect and condense a laser beam emitted from the surface-emitting laser array.

11. The laser device according to claim 10, further comprising a microlens array disposed between the surface-emitting laser array and the condensing optical system.

12. The laser device according to claim 10, further comprising a light transmission member to transmit light having passed through the condensing optical system.

13. A laser device comprising:
the surface-emitting laser array according to claim 8; and
a laser resonator to which a laser beam emitted from the surface-emitting laser array enters.

14. An ignitor comprising:
the laser device according to claim 13; and
an optical system to collect and condense a laser beam emitted from the laser device.

15. An internal combustion engine comprising the ignitor according to claim 14 to ignite fuel to generate inflammable gas.

16. An optical scanner comprising:
a scanning light source including the surface-emitting laser according to claim 1;
a light deflector to deflect light emitted from the scanning light source; and
a scanning optical system to collect and condense the light deflected by the light deflector.

17. The optical scanner comprising:
a scanning light source including the surface-emitting laser according to claim 8;
a light deflector to deflect light emitted from the scanning light source; and
a scanning optical system to collect and condense the light deflected by the light deflector.

18. An image forming apparatus comprising:
an image bearer to bear an image; and
the optical scanner according to claim 16 to scan the image bearer with light modulated according to data of the image.

19. An optical transmitter module comprising:
the surface-emitting laser array according to claim 8;
a drive device to drive the surface-emitting laser array to generate a light signal according to an input electrical signal.

20. A light transmission system comprising:
the optical transmitter module according to claim 19;
a light transmission medium to transmit a light signal generated by the optical transmitter module; and
a converter to convert the light signal transmitted from the light transmission medium into an electrical signal.

* * * * *